(12) United States Patent
Hamer et al.

(10) Patent No.: US 11,031,577 B1
(45) Date of Patent: Jun. 8, 2021

(54) MULTIMODAL MICROCAVITY OLED WITH MULTIPLE BLUE EMITTING LAYERS

(71) Applicant: OLEDWorks LLC, Rochester, NY (US)

(72) Inventors: John Hamer, Rochester, NY (US); Donald Preuss, Tuscan, AZ (US); Shane Matesic, Webster, NY (US)

(73) Assignee: OLEDWorks LLC, Rochester, NY (US)

(*) Notice: Subject to any disclaimer, the term of this patent is extended or adjusted under 35 U.S.C. 154(b) by 0 days.

(21) Appl. No.: 16/695,391

(22) Filed: Nov. 26, 2019

(51) Int. Cl.
*H01L 51/52* (2006.01)
*H01L 27/32* (2006.01)

(52) U.S. Cl.
CPC ........ *H01L 51/5271* (2013.01); *H01L 27/322* (2013.01)

(58) Field of Classification Search
CPC .............. H01L 51/5271; H01L 27/322; H01L 51/5265
See application file for complete search history.

(56) References Cited

U.S. PATENT DOCUMENTS

| 6,133,692 | A | 10/2000 | Hu et al. |
| 7,098,590 | B2 | 8/2006 | Lim et al. |
| 7,102,282 | B1 | 9/2006 | Yamada et al. |
| 7,273,663 | B2 | 9/2007 | Liao et al. |
| 7,888,860 | B2 | 2/2011 | Sung et al. |
| 8,877,350 | B2 | 11/2014 | Spinder et al. |
| 9,385,338 | B2 | 7/2016 | Wehlus et al. |
| 9,577,221 | B2 | 2/2017 | Weaver et al. |
| 9,655,199 | B2 | 5/2017 | Weaver et al. |

(Continued)

FOREIGN PATENT DOCUMENTS

| EP | 0683623 B1 | 9/2010 |
| JP | 2015130319 A | 7/2015 |
| WO | 2014039615 A1 | 3/2014 |

OTHER PUBLICATIONS

Lu et al, AppPhysLet, 92, 123303 (2008).

(Continued)

*Primary Examiner* — Stephen M Bradley
*Assistant Examiner* — Wasiul Haider

(57) ABSTRACT

A multimodal light-emitting OLED microcavity device, comprising: an opaque substrate; a layer with a reflective surface over the substrate; a first electrode over the reflective surface; organic layers for light-emission including a second blue light-emitting layer closer to the reflective surface and a first blue light-emitting layer further from the reflective layer than the second blue light-emitting layer, where the distance between the midpoints of the second and first blue-light emitting layers is $L_1$, and at least one non-blue light-emitting layer; a semi-transparent second electrode with an innermost surface through which light is emitted; wherein the distance $L_0$ between the reflective surface and the innermost surface of the semi-transparent second electrode is constant over the entire light-emitting area; and the ratio $L_1/L_0$ is in the range of 0.30-0.40. The multimodal microcavity OLED has increased blue emission and is particularly useful for use as the light source in a microdisplay.

17 Claims, 9 Drawing Sheets

(56) References Cited

U.S. PATENT DOCUMENTS

| | | |
|---|---|---|
| 9,685,622 B2 | 6/2017 | Song et al. |
| 10,290,825 B2 | 5/2019 | Lee et al. |
| 2004/0155576 A1 | 8/2004 | Tyan |
| 2005/0226994 A1 | 10/2005 | Tyan |
| 2006/0273714 A1 | 12/2006 | Forrest et al. |
| 2008/0203898 A1 | 8/2008 | Kobayashi |
| 2008/0224602 A1 | 9/2008 | Choi et al. |
| 2011/0140597 A1 | 6/2011 | Lee et al. |
| 2011/0297922 A1 | 12/2011 | Krause et al. |
| 2012/0012820 A1 | 1/2012 | Endo et al. |
| 2012/0248971 A1 | 10/2012 | Okutama |
| 2012/0319564 A1* | 12/2012 | Ghosh ............... B82Y 20/00 313/500 |
| 2013/0320837 A1 | 12/2013 | Weaver et al. |
| 2014/0183496 A1* | 7/2014 | Heo ............... H01L 27/322 257/40 |
| 2016/0181560 A1 | 6/2016 | Yamamoto et al. |
| 2019/0058018 A1 | 2/2019 | Guo |
| 2019/0109295 A1 | 4/2019 | Tang et al. |
| 2019/0319209 A1* | 10/2019 | Tanaka ............... H01L 27/3244 |

OTHER PUBLICATIONS

Young-Gu Ju (2011). "Micro-cavity in organic light-emitting diode", from Organic Light Emitting Diode—Material, Process and Devices, Prof. Seung Hwan Ko (Ed.), ISBN: 978-953-307-273-9.

Dodabalapur et al, AppPhysLet, 64(19) 2486 (1994).

Dodabalapur et al, AppPhysLet, 65(18), 2308 (1994).

O.H. Crawford, J. Chem. Phys. 89 (10), 6017-6027 (1988).

Chen et al, Organic Electronics, 12, 2065(2011); and Park et al, ACS Photonics, 5, 655-662 (2018).

Modern Optics by Grant R. Fowles, Holt Reinhart and Winston, Inc., 1968, ISBN 0-03-065365-7 O.H. Crawford, J. Chem. Phys. 89 (10), 6017-6027 (1988).

PCT International Search Report and Written Opinion, dated Feb. 9, 2021, for equivalent PCT application PCT/US2020/061766.

* cited by examiner

MULTIMODAL MICROCAVITY OLED WITH MULTIPLE BLUE EMITTING LAYERS

BACKGROUND

Typically, a microdisplay is less than two inches diagonal (approx. 5 cm) down to an ultra-small display size of less than 1" diagonal. In most cases, the resolution of the microdisplay is high and the pixel size is usually 4 to 15 microns. First introduced commercially in the late 1990s, they are commonly used for rear-projection TVs, head-mounted displays, and digital cameras. In recent years, devices like smart watches have taken advantage of the high resolution and low power consumption of these displays. Microdisplays are expected to proliferate with the global market projected at 20% compound annual growth rate in the next few years. One of the trends driving this growth will be the increasing adoption of near-eye displays and augmented reality devices and virtual reality devices such as head-mounted displays (HMDs), head-up displays (HUDs), and electronic view finders (EVFs).

There are two main categories of microdisplays. The first is a projection microdisplay, which involves a highly magnified image projected onto a surface. Types of projection microdisplays include rear-projection TVs and compact data projectors. The second is a near-to-eye display (NED), which consists of a highly magnified virtual image viewed through an eyepiece (such as a virtual reality headset or camcorder viewfinder). These displays are increasingly being used in HMDs and HUDs, especially in the military and medical industries.

Both types of microdisplays offer significant advantages over conventional direct-view displays such as flat-panel LCDs. Microdisplay advantages include the ability to produce a large image from a very small, lightweight source display unit, making them easy to integrate into space-constrained technology, such as wearables; large pixel capacity, producing high resolution and clarity; and greater power-efficiency as compared to other display types. The higher the resolution and brightness, and the lower the power consumption, the better quality the microdisplay. The challenge for microdisplay makers, however, has been relatively high production costs, together with the need for high brightness and long operational lifetime.

Microdisplays can be made from a range of display technologies, including Liquid Crystal On-Silicon (LCoS); Liquid Crystal Displays (LCD); Digital Micromirror Devices (DMD); Digital Light Processing (DLP); and more recently, MicroLED (Light Emitting Diode) and Organic Light Emitting Diode (OLED).

LCD has dominated the microdisplay market in recent years. LCD technology offers high brightness, relatively low cost, and a relatively simple manufacturing process. Using LCDs, device manufacturers have been able to reduce the size of microdisplay components over time. LCD displays are currently being used in some HMDs, HUDs, EVFs, and thermal-imaging glasses and wearables. However, LCD microdisplays require a light source, or a backlight, in order to create an image together with liquid crystal array in order to modulate the light. This technology has limitations, such as polarization, color space, maximum luminance limitation, LC temperature sensitivity, viewing angles, LCD transmission and extinction ratio, system limited dimensions and others, which may not provide all of the desired performance characteristics.

Microdisplay based on microLED technology could provide advantages over LCD microdisplays, such as self-emission, a larger color gamut, wide viewing angles, better contrast, faster refresh rate, lower power consumption (image dependent), and wide operation temperature range. Currently, microLED microdisplays are based on a standard Gallium Nitride (GaN) wafer, adopted from standard LEDs. This approach has the potential to provide high luminance display device without lifetime issues at a relatively low price. In general, the standard GaN wafer is patterned into arrays of micro-LEDs. The microLED display is then produced by an integration of the microLED array and transistors. However, this approach has several manufacturing concerns including monolithic formation of the microLEDs over the transistors, pixel spacing, color generation, and spatial uniformity due to variations of color and luminance between the individual microLEDs.

OLED technology shares many of the attractive features of microLED technology for microdisplays. It is self-emissive, has excellent image quality, is very efficient comparing to LCD or LCoS, and has an ultra-high color rendition and wide color space. Self-emissive OLED devices have the important advantage over backlight devices (such as LCD) in that each pixel only produces the intensity required by the image, whereas backlighted pixels produce maximum intensity followed by absorption of the unwanted light. Moreover, formation of an OLED over the transistors is much easier and lower cost than formation of a microLED because OLED layers can be vacuum deposited or directly coated. On the other hand, OLEDs can have limited luminance and limited lifetime.

There are two basic approaches to making a pixelated OLED display (including a microdisplay) where it is necessary to control the brightness of each individual pixel by supplying power to one of the pixel electrodes via control circuitry (transistors). The first approach involves having each pixel individually produce red, green or blue light (R, G, B respectively). The second approach is to have a common multimodal (white) light emitting OLED layer across all pixels with a color filter array (CFA) in order to produce individual RGB pixels. The second approach has an advantage over the first in that it is not necessary to create individual OLED pixels of different formulations and so, manufacturing costs will be reduced.

OLED-based microdisplays will require very high luminance from the OLED light-generating layers. One well-known method of increasing the luminance and color purity of OLED emission is by taking advantage of the optical microcavity effect. This effect is based on creating an optical resonator between a reflecting surface and a semi-reflective surface which allows some light to pass. Multiple reflections between the two surfaces create standing waves, depending on optical distance between the two surfaces, which will intensify some wavelengths of light and decrease others because of constructive and destructive interference effects that will occur depending on whether the emissions are generated at the anti-nodes or nodes, respectively, of the standing waves. The anti-nodes occur at different locations depending on the total space between the reflectors, and on the wavelength being optimized. Optical models based on mathematical calculations can be useful in determining the ideal emitter positions for a given structure.

Among the factors which affect the locations of anti-nodes and subsequently the best emitter locations are the total optical distance between the reflectors, the phase shift which is known to occur when light is reflected off of an optical absorber or reflector, the index of refraction of the organic layers, and reflective interfaces on the outside of the semi-transparent reflector.

As the optical thickness of the microcavity is increased compared to the wavelength of light in the organic medium, there can be multiple anti-nodes for a particular color within the microcavity. The opportunity presents itself to utilize multiple emitters of the same spectrum in order to meet the desired output requirements for a particular use. The multiple emitters could be used by themselves to make an extremely bright monochrome display, or it could be used with other emitters to produce a balanced white display.

However, the light emitted from microcavities can show severe angular dependence, where there can be color shifts and loss of luminance as the angle of viewing deviates from perpendicular to the viewing surface. This is often not a problem for NED applications due to the limited entry-angle of the projection optics.

It would be desirable to make an OLED-based microdisplay using a multimodal light-emitting OLED microcavity. That is, a microdisplay where the light-emission comes from a single light emitting OLED unit that is multimodal (more than one color of light); is common to all pixels; and that the emission color of the individual pixels is controlled by a color filter array to make RGB (or RGBW if some pixels have no color filter).

Multimodal (or white) light-emitting OLEDs utilizing microcavity effects are known. Examples include: U.S. Pat. Nos. 6,133,692; 7,102,282; EP0683623; U.S. Pat. No. 9,385,338; JP2015130319; U.S. Pat. No. 7,888,860; WO2014039615; Lu et al, AppPhysLet, 92, 123303 (2008); Young-Gu Ju (2011). "Micro-cavity in organic light-emitting diode", from Organic Light Emitting Diode—Material, Process and Devices, Prof. Seung Hwan Ko (Ed.), ISBN: 978-953-307-273-9; Chen et al, Organic Electronics, 12, 2065(2011); and Park et al, ACS Photonics, 5, 655-662 (2018).

U.S. Pat. No. 7,098,590 describes a passive-matrix display using white OLED microcavities where the thickness of the microcavity is an integer multiple of the sum of half the peak wavelength of the light-emitting layers within the microcavity.

However, none of the approaches described by these references can provide the necessary high luminance required, particularly in terms of blue light. This is because OLED blue light-emitters generally have lower efficiency than either the best G or R emitters. For example, phosphorescent G, Y and R emitters can have very high efficiency and excellent stability. However, even the best examples of phosphorescent B emitters will have lower efficiency than the G or R emitters and will also be significantly less stable. Blue emitting TADF (thermally active delayed fluorescent) compounds can be more stable, but still do not approach the efficiency of phosphorescent G and R emitters. Fluorescent B emitters can be more stable yet, but are significantly less efficient than phosphorescent emitters. In practical terms, many white light-emitting OLEDs suffer from low B emission relative to G and R emission.

This imbalance in terms of RGB emission can be addressed in many ways. The efficiency of the G and R emitters can be decreased, but this approach lowers the overall efficiency of the device. In displays, the blue pixels can be run at higher current relative to the G and R pixels in order to balance the overall emission, but since the stability of OLED materials is inversely proportional to the applied current, the overall device lifetime can be shortened. The number or size of B pixels relative to the G and R pixels can be increased, but this can affect resolution since the effective distances between adjacent G or R pixels (which carry most of the resolution information) will be increased. None of these potential solutions would be desirable for a microdisplay.

Another approach to increase the amount of B emission in a white light-emitting OLED would be to use multiple blue light-emitting layers. Examples of this can be found in U.S. Pat. Nos. 8,877,350; 9,655,199; 9,577,221; US20110297922; US20120012820; US20130320837; US20080224602; US20060273714; and U.S. Ser. No. 10/290,825. However, none of these concern microcavity OLEDs and these arrangements may not be appropriate for microcavity applications.

US20120248971 and U.S. Pat. No. 9,685,622 both describe white emitting OLEDs where the light-emitting layers are located at specific distances from a reflective cathode. US20160181560 describes OLEDs with three light-emitting layers, which are directly adjacent to each other, where the intermediate light-emitting layer emits a different color than the two outside layers, which can emit the same color of light. However, none of these concern microcavity OLEDs and these arrangements may not be appropriate for microcavity applications.

U.S. Pat. No. 7,273,663 describes OLEDs with multiple stacks of white light-emitting units, each separated by intermediate connection layers, in a non-microcavity application. In this approach, each individual white light-emitting unit has a blue light-emitting layer, so there are multiple B light-emitting layers within the device which are separated by light-emitting layers that emit a different color of light. However, such a device, which has multiple G and R layers as well, would also suffer from an imbalance between B light and G and R light. This arrangement may not be appropriate for microcavity applications with multiple stacks of light-emitting layers.

There exists a need for a white light-emitting OLED formulation with increased blue emission that would be suitable for use in a microdisplay. A white light-emitting microcavity OLED with at least two blue-emitting layers can provide increased blue emission. Depending on the size of the microcavity, the spacing of the blue light-emitting layers relative to each other as well as to the reflective surface of the microcavity can be important to achieve high blue emission.

SUMMARY

Useful as a light source for a microdisplay is a multimodal light-emitting OLED microcavity device, comprising an opaque substrate; a layer with a reflective surface over the substrate; a first electrode over the reflective surface; organic layers for light-emission including first and second blue light-emitting layers, the second blue light-emitting layer closer to the reflective surface and the first blue light-emitting layer further from the reflective layer than the second blue light-emitting layer, where the distance between the midpoints of the second and first blue-light emitting layers is $L_1$, and at least one non-blue light-emitting layer; a semi-transparent second electrode with an innermost surface through which light is emitted; wherein the distance $L_0$ between the reflective surface and the innermost surface of the semi-transparent second electrode is constant over the entire light-emitting area; and the ratio $L_1/L_0$ is in the range of 0.30-0.40.

In some embodiments, the multimodal light-emitting microcavity can have a ratio $L_2/L_0$ in the range of 0.90-0.98, where $L_2$ is the distance between the midpoint of the first blue light-emitting layer and the reflective surface. Such embodiments can also have a ratio $L_3/L_0$ in the range of 0.52-0.64, where $L_3$ is the distance between the midpoint of the second blue light-emitting layer and the reflective surface.

The multimodal light-emitting microcavity OLED can have two different ranges for the distance $L_0$; the first range where the distance $L_0$ is in the range of 6500-7800 Å and a second range where the distance $L_0$ is in the range of 8000-9000 Å.

In some embodiments, the non-blue light-emitting layer is located between the first and second blue light-emitting layers, and can be green light-emitting. There can be a second non-blue light-emitting layer that is located between the second blue light-emitting layer and the reflective surface, which can be red light-emitting. There can be a third blue light-emitting layer that is located between the red light-emitting layer and the reflective surface. There can also be a fourth blue light-emitting layer located between the third blue-light emitting layer and the reflective surface.

In some embodiments, the uppermost surface of the anode is the reflective surface.

The multimodal light-emitting OLED described above can be used in a microdisplay, where the substrate of the multimodal light-emitting microcavity OLED includes a backplane with control circuitry for the individual operation of subpixels; and there is a color filter array over the semi-transparent cathode that is aligned with the individually controlled subpixels so that at least R, G, B subpixels are formed. In some embodiments, the microdisplay is a RGBW microdisplay.

DETAILED DESCRIPTION

Figure 1:
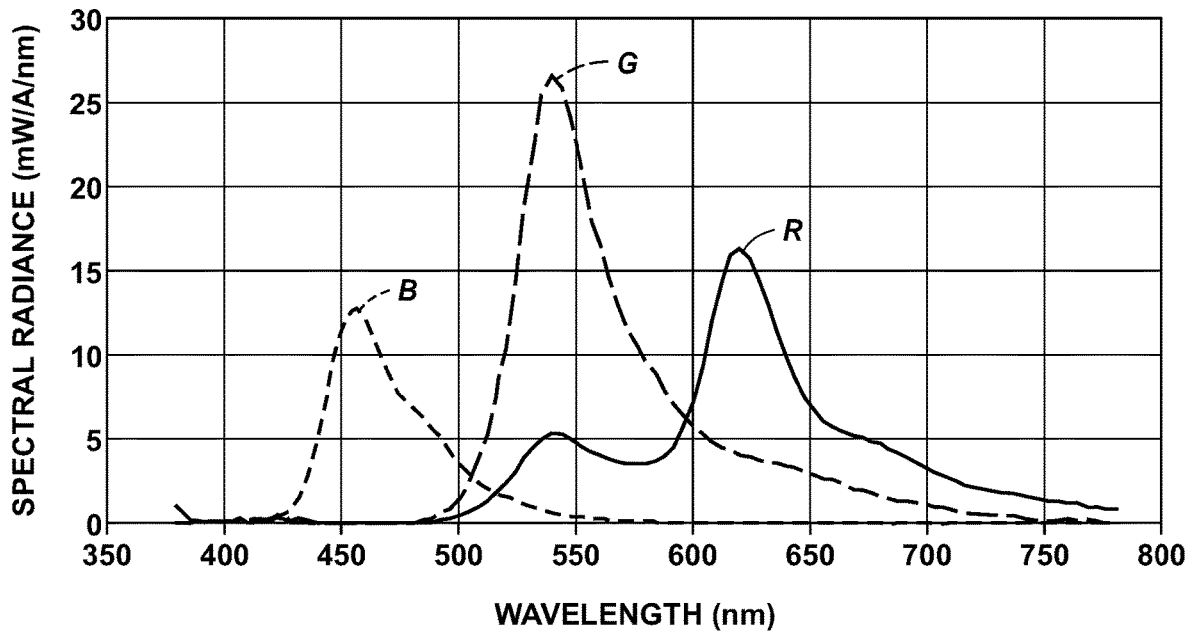
FIG. 1 shows spectra (Intensity vs Wavelength) of typical OLED emitters in a non-microcavity environment without any nearby interfaces.

For the purposes of this disclosure, the terms "over" or "above" mean that the structure involved is located above another structure, that is, on the side opposite from the substrate. "Uppermost" or "upper" refers to a side or surface further from the substrate while "bottommost" or "bottom" refers to the side or surface closest to the substrate. "Interior" or "inner" refers to the side or surface of a layer that its closest to the organic layers within the microcavity. Unless otherwise noted, "over" should be interpreted as either that the two structures may be in direct contact or there may be intermediate layers between them. By "layer", it should be understood that a layer has two sides or surfaces (an uppermost and bottommost) and that multiple layers may be present and is not limited to a single layer.

R indicates a layer that primarily emits red light (>600 nm, desirably in the range of 620-660 nm), G indicates that a layer primarily emits green light (500-600 nm, desirably in the range of 540-565 nm) and B indicates a layer that primarily emits blue light (<500 nm, desirably in the range of 440-485 nm). The selection of these ranges is dictated by the desired color gamut and the photopic response as well as the emitters available, and not by the optics of the microcavity. The microcavity is selected to best support the desired wavelength ranges.

It is important to note that R, G and B layers can produce some degree of light outside the indicated range, but the amount is always less than the primary color. Y (yellow) indicates that a layer that emits significant amounts of both R and G light with a much lesser amount of B light. "LEL" means light-emitting layer. Unless otherwise noted, wavelengths are expressed in vacuum values and not in-situ values.

A multimodal OLED produces more than one color of light. Ideally, a multimodal OLED produces a white light with roughly equal amounts of R, G and B light. Typically, this would correspond to $CIE_x$, $CIE_y$ values of approximately 0.33, 0.33. White light, even if does not contain equal amount of R, G, B light, can generally be produced in OLEDs by having three separate R, G and B light-emitting layers, two separate light emitting layers such as blue and yellow, or even a single white light-emitting layer. However, the use of light-emitting layers with mixed emission (for example, a Y layer) often results in an inherent loss of efficiency since the total emission is divided into different channels. Using emitters of different colors within a single layer can be problematic, since the emitter with the lower energy of emission will predominate.

The theory behind the microcavity effect is well-known and can be modeled in order to predict the most desirable locations within the microcavity in order to maximize constructive interference for any specific wavelength. For example, see Introduction to Modern Optics by Grant R. Fowles, Holt Reinhart and Winston, Inc., 1968, ISBN 0-03-065365-7; O. H. Crawford, J. Chem. Phys. 89 (10), 6017-6027 (1988); Dodabalapur et al, AppPhysLet, 64(19) 2486 (1994); and Dodabalapur et al, AppPhysLet, 65(18), 2308 (1994).

In general, modelling of an OLED microcavity suggests that the maximum emission efficiency will be found if the light is generated at an antinode that is some odd multiple of a quarter wavelength between the reflective and semi-transparent surfaces of the microcavity, when adjusted for any phase shifts at the two reflectors. The antinodes for different "colors" will be at different locations within the microcavity since the wavelengths are different. In this case, quarter-wavelength refers to the wavelength within the device medium, not vacuum. In other words, theory predicts that emitting layers according to the emission wavelength should be located at specific distances (i.e. at the antinodes) between the defining surfaces of the microcavity in order to maximize the microcavity effect that increases efficiency.

It is important to understand that microcavity theory relies on optical distance which may not be the same as the physical distance. Optical distance is the product of the physical distance times the refractive index, which can be wavelength dependent. For example, for a typical organic non-emitting OLED material, the index would be about 1.906 @ 400 nm, 1.85 @ 450 nm, 1.80 @ 500 nm, 1.77 @ 550 nm, 1.75 @ 600 nm and 1.73 @ 650 nm. However, since all of the OLED materials within the microcavity will have similar refractive indexes with a similar wavelength dependence, the physical distance will proportionally correspond to the optical distance within a tolerable limit. For the purposes of this application, physical distance will be used instead of optical distance for all microcavity distances, unless otherwise noted OLED emitters tend to be relatively broad with significant amounts of emission at wavelengths near the maximum wavelength. FIG. 1 shows the spectra for typical B, G and R OLED emitters in a non-microcavity environment. For these particular emitters, the B $\lambda_{max}$=456 nm, G $\lambda_{max}$=540 nm and R $\lambda_{max}$=620 nm. Based on these examples, the integration ranges used in calculations are 562-682 nm for red, 486-594 nm for green, and 410-498 nm for blue light, which represents center wavelengths of 620 nm, 540 nm and 456 nm and a bandwidth of +/−10%.

Figure 2:
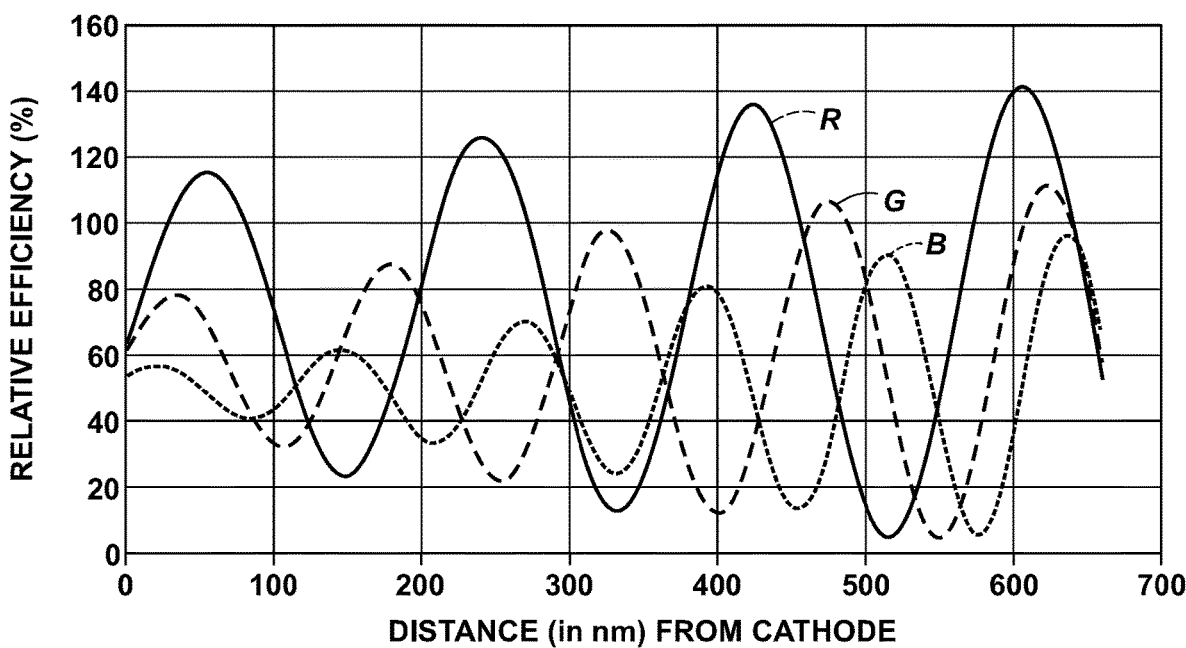
FIG. 2 shows a plot of the calculated relative efficiency for R, G and B colors versus distance from an electrode in a 695 nm microcavity.

The overall thickness of the microcavity will have an effect on the wavelength of the emitted light. For example, FIG. 2 shows the calculated locations (in terms of distance from the cathode to the midpoint of the emitting layer) for anti-nodes (higher intensity) and nodes (lower intensity) for a single theoretical white emitter in a 695 nm microcavity, wherein the cathode and anode are the reflective and semi-reflective electrodes, respectively. The outputs have been normalized to the normal output into air of radiant white emitter embedded in glass. Within this size of microcavity, there are four high intensity positions for red light, 5 high intensity peaks for green light and 6 high intensity peaks for blue light. Also, the model indicates that for red and green light, the preferred intensities are roughly similar within the microcavity, but for blue light, higher intensities are predicted closer to the anode.

Figure 3:
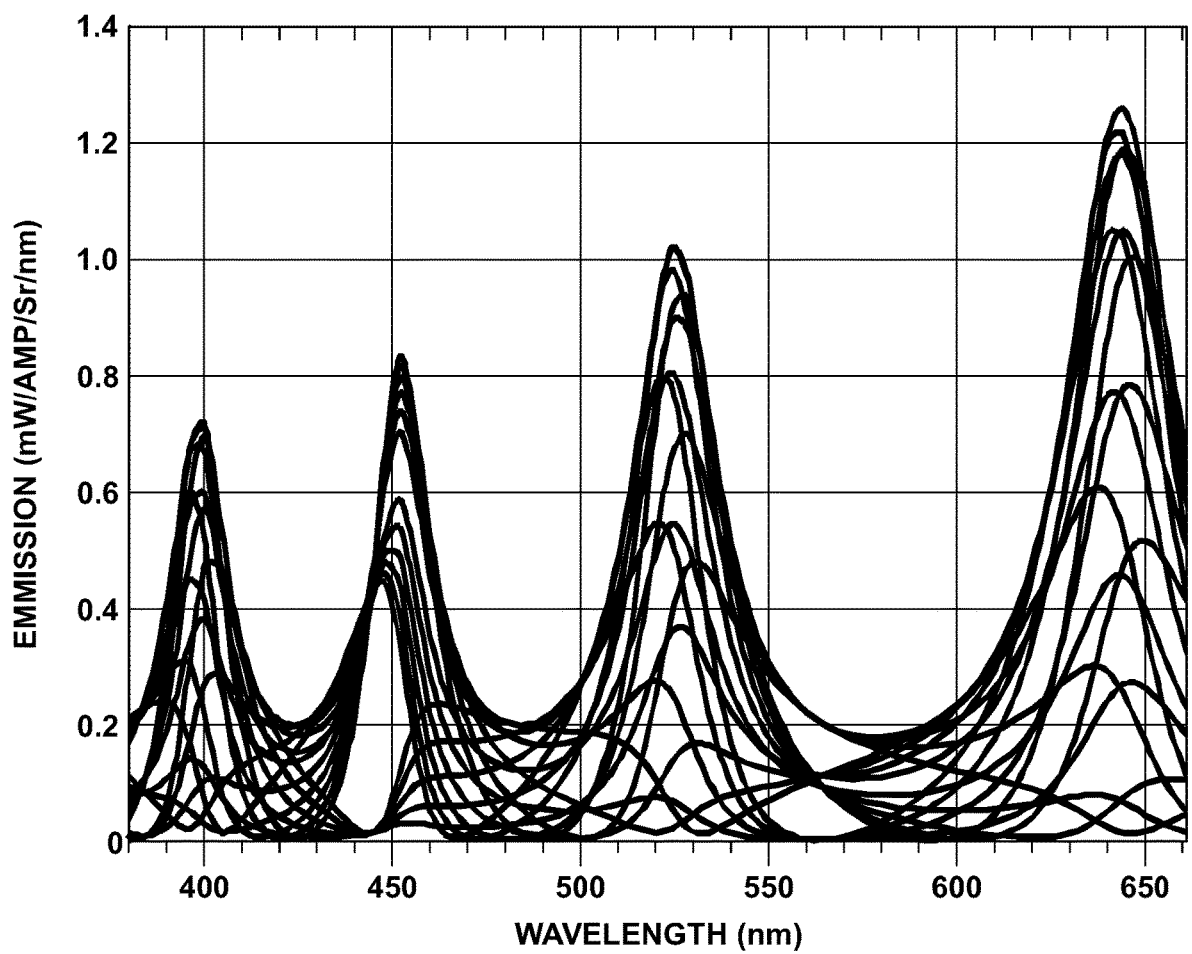
FIG. 3 shows a plot of calculated emission intensity versus wavelength over a range of emitter positions for a 6960 Å microcavity.

Since the light within the microcavity forms standing waves based on the optical distance of the microcavity, there are be multiple nodes where the optimum intensification occurs. FIG. 3 shows the wavelengths of light which are intensified within a 6950 Å microcavity. Each curve (not individually identified) in FIG. 3 represents the predicted emission at each wavelength for a theoretical white emitter placed at multiples of 40 nm of distance from the reflective electrode. The peaks in the envelope of curves of FIG. 3 show the wavelengths which can be intensified if the proper emitter positions are selected. The wavelengths at the bottom of the envelope of curves cannot be intensified for any emitter positions.

The desired overall size or width of a microcavity is determined by four factors: the desired emission output (which can be modulated by the use of color filters), the spectrum (intensity vs wavelength) of the light emitter within the LEL, the thickness of the LELs and the driving voltage (driving voltage increases with device thickness and the number of LELs present). It is important to note that a different sized microcavity will have a different emission output than another, even if all internal components within the microcavity are the same. This is because the microcavity effect depends not only on the overall size of the microcavity, but also on the location within the microcavity where photons of a given wavelength are generated. All of these factors must be considered when designing a high efficiency OLED microcavity, along with the compromises necessary for their incorporation.

However, it may not always be possible to locate the emitting layers in the desired location according to microcavity theory. This is because it is also necessary to simultaneously manage the hole/electron recombination within the individual light emitting layers, manage the charge transfer through the organic layers between the electrodes, and prevent undesirable interactions between the individual light emitting layers. All of these are managed by using different materials in different layers; layers which require certain thicknesses to accomplish their purpose. This can become particularly difficult when using two separate blue layers since they will occupy different locations so that the microcavity effect is maximized for each. Compromises may need to be made to balance these requirements.

Since the multimodal OLED microcavity will include at least two blue LELs and at least one other (non-blue) color, the size of the microcavity needs to be large enough to accommodate multiple anti-nodes for each of the colors so that all of necessary LELs can be spaced apart as necessary to maximize intensity. This also leaves space for non-light-emitting layers to help maintain charge flow through the devices as well as preventing undesired cross-talk between LELs of different colors or different lateral areas in the device.

There are two different desirable ranges for the thickness $L_0$ for a multimodal microcavity (the distance between the uppermost surface of the reflective layer and the bottommost surface of the semi-transparent electrode). This is because each range, according to microcavity theory, can accommodate different numbers of antinodes for each of the R, G and B colors in an efficient manner. The first desirable range for $L_0$ is 6000-8000 Å with a more desirable range of 6500-7800 Å. The second desirable range for $L_0$ is 7500-9500 Å with a more desirable range of 8000-9000 Å. Of these two ranges, the first range is preferred.

Figure 4:
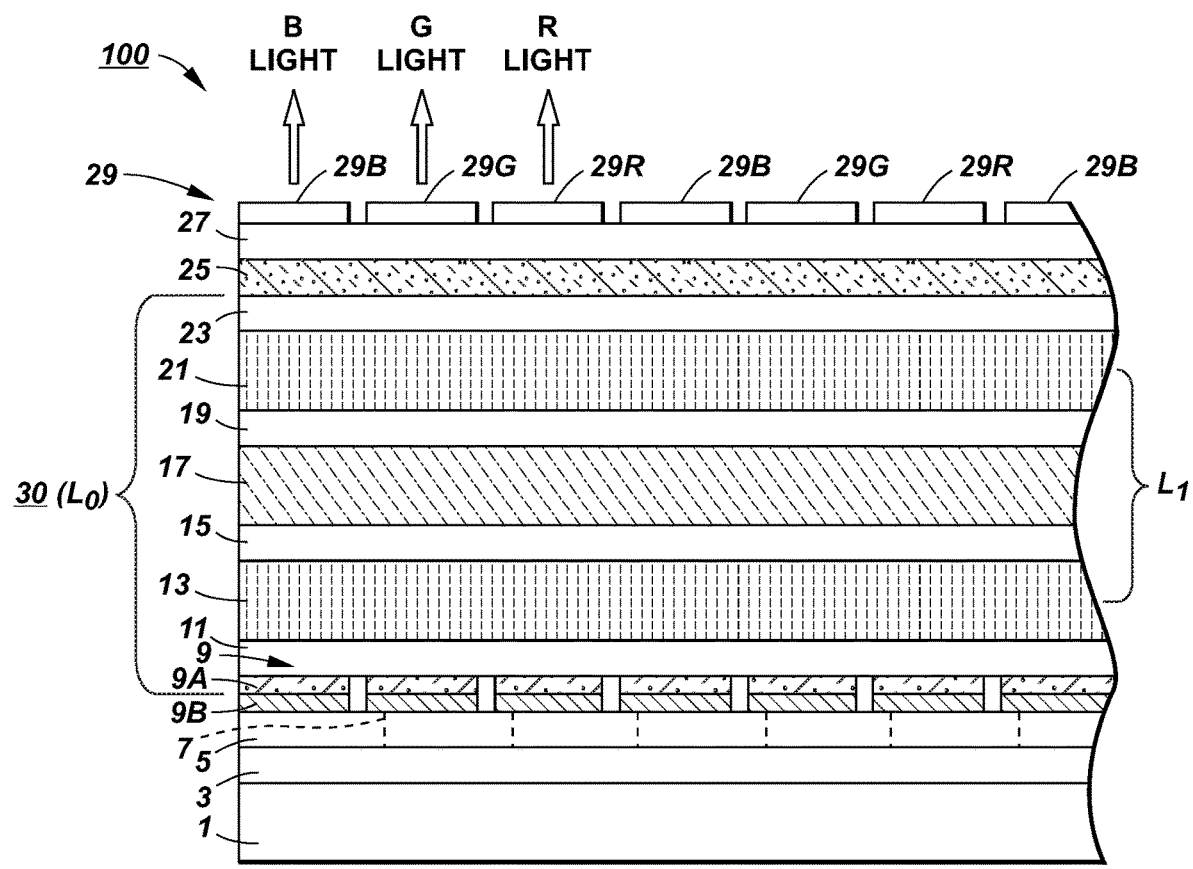
FIG. 4 shows a schematic cross-section of a microdisplay 100 using the OLED microcavity according to the invention.

FIG. 4 illustrates a microdisplay 100 that uses the multimodal OLED microcavity according to the invention. There is a substrate 1 with an overlying layer 3 which contains transistors, connecting electrical traces and other necessary components which form the control circuitry that will supply power to the subpixels according to an input signal. Over the layer 3 with the transistors and control circuitry, there can be an optional planarization layer 5. The substrate 1/control circuitry layer with transistors 3/optional planarization layer 5 is often referred to as a backplane.

Over layer 5 (if present), are individual first electrode segments 9 which are connected by electrical contacts 7, which extend though the optional planarization layer to make electrical contact between the individual electrode segments 9 and the control circuitry in layer 3. In this embodiment, the first electrode segments 9 have two layers, a reflective layer 9B which is closer to the substrate 1, and a first electrode layer 9A which is closer to the OLED layers. The individual first electrode segments 9 are electrically isolated from each other laterally. Over the segmented first electrode segments 9 are non-light-emitting OLED layers 11, such as electron- or hole-injection or electron- or hole-transport layers. This embodiment includes a first and a second blue light-emitting layer. Second blue light-emitting layer 13 is over OLED layers 11. Layer 15 is a charge-generation layer which lies between and separates the second blue light-emitting layer 13 and a non-blue light-emitting layer 17. Over the non-blue light-emitting layer 17, there is a charge-generation layer 19 that lies between and separates the non-blue light-emitting layer 17 and a first blue-light-emitting layer 21. The physical distance between the midpoint of the second blue light-emitting layer 13 and the first blue-light emitting layer 21 is distance $L_1$. Over the second blue-light-emitting layer 21 are nonlight-emitting OLED layers 23, such as electron- or hole-transport layers or electron- or hole-injection layers, and semi-transparent second electrode 25. This forms an OLED microcavity 30 of distance $L_0$ that extends from the uppermost surface of reflective surface 9B to the bottommost surface of the semi-transparent second electrode 25, which is also a semi-reflective electrode. The OLED microcavity is protected from the environment by an encapsulation layer 27. In this embodiment, there is a color filter array with color filters 29B, 29G and 29R which filter the multimodal emission generated by the OLED microcavity 30 so that B, G and R light is emitted according to the power supplied to the underlaying electrode segment 9.

In the OLED microdisplay 100, both the first electrode 9A and the reflective layer 9B are segmented; that is, are divided into electrically isolated individual sections corresponding to a sub-pixel and are not continuous across the active light-emitting surface. However, in some embodiments where the reflective layer is not electrically conductive, the reflective layer does not have to be segmented but can extend continuously underneath the isolated sections of first electrode 9A throughout the active light emitting area. In such applications, the electrical contacts 7 will pass through the reflective layer 9B to connect the electrode segments 9A to the control circuitry in layer 3. When the reflective layer 9B is electrically conductive and segmented, it is only necessary for the electrical contacts 7 to contact the reflective layer 9B segment directly. The subpixel layout or segmented electrode layout is not critical; all known layouts could be used.

Microdisplays such as microdisplay 100 should have an emitting area of no more than 100 cm² (i.e. a 20 cm×5 cm rectangle or a 10 cm×10 cm square) and desirably no more than 24 cm² (i.e. a 6 cm×4 cm rectangle). Viewing distance is typically expected to be no more than 20 cm and desirably no more than 15 cm. The microdisplay can have any shape including square, rectangular, round, oval as well as irregular shapes.

Microdisplays such as microdisplay 100 will typically be full-color; that is, will have B, G and R subpixels as shown. Since the OLED microcavity within the microdisplay is multimodal, the color of the individual subpixels is defined by the presence of a color filter array located in the pathway of the emitted multimodal light. A color filter array (CFA) is a mosaic of color filters (generally red, green and blue) that overlays the subpixels. The color filters then prevent light outside the desired color from being transmitted. If the color filter array contains some subpixels with no or clear filters so that the light emitted from the OLED microcavity passes through without filtering, then the microdisplay will be 4 color (RGBW) which can be advantageous for some applications. In other applications, the color filter array can have color filters that are the same so that the microdisplay is monochromatic. In monochromatic displays, there may just a single-color filter instead of an array. Alternatively, the color filter array can have two kinds of filters so that the microdisplay is bichromatic. The color filter array can be deposited on the encapsulation layer 27 or can be applied as a separate pre-formed component and applied externally to an already encapsulated OLED microcavity with adhesives. Alternatively, it could be located between the semi-transparent second electrode 25 and the encapsulation 27 so that the CFA is within the encapsulated OLED microcavity.

Microdisplay 100 is opaque and top-emitting; that is, light is emitted from the side opposite to the substrate 1 and not though the substrate 1. This is because of the presence of the control circuitry layer 3, which is opaque, over the substrate and beneath the OLED microcavity. Thus, the OLED microcavity must be arranged to emit light through the top since there is an opaque layer between the light emitting layers and the substrate. However, microdisplays such as microdisplay 100 can be made at least partially transparent by creating transparent areas between the opaque control circuitry areas so at least some light can pass through the microdisplay.

In FIG. 4, the physical distance $L_0$ of the microcavity 30 is constant throughout the entire active light-emitting area. In particular, the thickness of the microcavity 30 is not adjusted on the basis of the color of light of the sub-pixel. In the microdisplays using the OLED microcavity of the invention, all subpixels will have the same microcavity thickness $L_0$.

Figure 5:
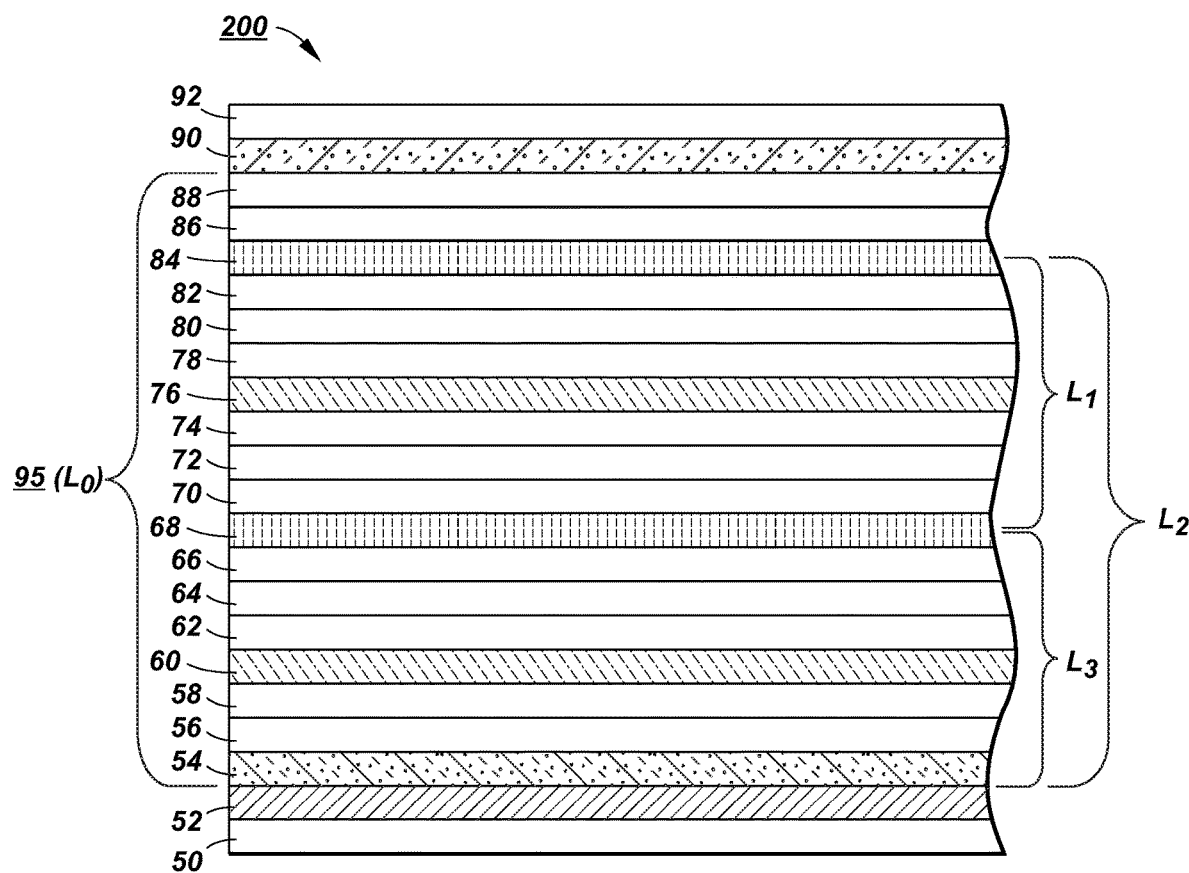
FIG. 5 shows a cross-section of a first OLED microcavity device 200.

FIG. 5 illustrates a cross-section of one embodiment of a top-emitting OLED microcavity device 200 according to the invention, which includes two non-blue light-emitting layers. On a substrate 50, there is deposited, in sequence, an unsegmented reflective layer 52, an unsegmented first electrode 54, a hole-injection layer 56, a hole-transport layer 58, a second non-blue light-emitting layer 60, an electron-transport layer 62, a charge-generation layer 64, a hole-transport layer 66, a second blue light-emitting layer 68, an electron-transport layer 70, a charge-generation layer 72, a hole-transport layer 74, a first non-blue light-emitting layer 76, an electron-transport layer 78, a charge-generation layer 80, a hole-transport layer 82, a first blue light-emitting layer 84, an electron-transport layer 86, an electron-injection layer 88, a semi-transparent (and semi-reflective) second electrode 90 and finally, encapsulation 92. There may be other layers not shown between the various identified layers. The distance $L_0$ of microcavity 95 is defined by the uppermost surface of reflective layer 52 and the bottommost surface of the semi-transparent second electrode 90. $L_1$ is the physical distance between the midpoint of the second blue-light emitting layer 68 and the midpoint of the first blue-light emitting layer 84. $L_2$ is the physical distance from the midpoint of the first blue-light emitting layer 84 and the uppermost surface of the reflective layer 52. $L_3$ is the physical distance between the midpoint of the second blue-light emitting layer 68 and the uppermost surface of the reflective layer 52.

The substrate 1 of the microdisplay 100 or substrate 50 of the OLED microcavity device 200 can be silicon, glass (including flexible glass), metal or polymeric materials. Generally speaking, it will be flat with a uniform thickness. For bottom emitting OLEDs, the substrate should be transparent. For top emitting OLEDs, the substrate may be opaque or transparent (allowing for two-sided emission) as desired. The top surface of the substrate is that facing the OLED. Since the substrate will be part of the overall encapsulation for the OLED, it should be sufficiently impervious to air and water so that the OLED will have desired lifetime. The substrate can be rigid or flexible. The substrate may have various types of subbing layers (i.e. planarization layers, light management layers, etc.) which may be patterned or un-patterned and can be either on the top or bottom surfaces.

The uppermost internal reflecting surface of the reflective layer 52 defines a first side of the microcavity 95. The reflective layer 52 can be a reflective metal such as Al, Au, Ag, Mg, Cu or Rh or alloys thereof, a dielectric mirror or a high-reflection coating. Dielectric mirrors are constructed from multiple thin layers of materials such as magnesium fluoride, calcium fluoride, and various metal oxides, which are deposited onto the substrate. High-reflection coatings are composed from multiple layers of two materials, one with a high index of refraction (such as zinc sulfide (n=2.32) or titanium dioxide (n=2.4)) and one with a low index of refraction (such as magnesium fluoride (n=1.38) or silicon dioxide (n=1.49)). The thicknesses of the layers are generally quarter-wave in terms of wavelength to the light being reflected. It is desirable that the reflective layer reflect at least 80% of the incident light and most preferably, at least 90%. The preferred reflective layer is Al or Ag, with a thickness of 300-2000 Å, most preferably 800-1500 Å.

In the OLED microcavity device 200, the first (bottom) electrode layer 54 is unsegmented; that is, it is continuous and undivided across the entire active light-emitting area. Thus, OLED microcavity device 200 is a large area light emitter, suitable for lighting and backlight applications, and not a display. In the OLED microcavity 95 in FIG. 5, the physical distance $L_0$ from the reflective surface to the semi-transparent second electrode is constant throughout the entire active light-emitting area.

In both the microdisplay 100 and the OLED microcavity device 200, the first electrode segments 9A or first electrode layer 54 can be an anode or a cathode and can be transparent, reflective, opaque or semi-transparent. In applications where the first electrode is over the reflective layer, it should be transparent. However, in other applications, the first electrode layer 9A, 54 is reflective so that its uppermost reflective surface forms one side of the optical microcavity 95.

Desirably, the first electrode is a transparent anode and should transmit as much visible light as possible, preferably having a transmittance of at least 70% or more desirably at least 80%. While the first transparent electrode may be made of any conductive materials, metal oxides such as ITO or AZO or thin layers of metals such as Ag are preferable. Poorly conducting materials (e.g. TiN) can be used for 9A and 54 providing they are made thin.

The minimum thickness of the reflective layer and/or first electrode is determined by the required reflectivity and conductivity. For small pixels (nm), conductivity is not an issue. For large-area devices (mm to cm) there must not be a voltage drop across the electrode which would cause a variation of brightness in the device. Another factor to be considered is the layer having similar properties to the bulk. In the case of Ag, one must be certain of the uniformity as it tends to aggregate when made too thin. This would be a problem if the layer were only a few monolayers of atoms (20 to 50 Å). When the anode and the reflective layer are the same layer, it is desirably made of a metal including Al, Au, Ag or Mg of alloys thereof and having a thickness of at least 30 nm, desirably at least 60 nm.

Reflective anodes may require a thin additional coating of an inorganic material to help improve hole transport across the reflective anode/organic layer interface or to protect the reflective metal surface during handling and cleaning. When a transparent anode is located over a reflective surface, it is part of the optical cavity.

Electron-transport and hole-transport materials suitable for use in non-emitting layers such as hole-injection layer 56, hole-transport layers 58, 66, 74, 82 or electron-injection layer 88 or electron-transport layers 62, 70, 78, 86 are well-known and commonly used. These layers may be mixtures of such materials and may contain dopants to modify their properties. Since they are non-light emitting, they do not contain emitting materials and are transparent. The choice of appropriate materials is not critical and any may be selected based on their performance.

Since the spacing between the various LELs within the microcavity as well as the size of the microcavity is important to maximize efficiency, it is typically necessary to select the thickness of various non-light-emitting layers to provide the desired spacing. Desirably, the adjustment of the spacing between LELs as well as the size of the microcavity is provided by using the appropriate thickness of the hole transport layers such as 58, 66, 74, or 82.

In the embodiment shown in FIG. 5, there is a second non-blue light emitting layer 60 closer to the reflective surface 52 than the second blue light-emitting layer 68. The second non-blue LEL 60 may not be present in some embodiments and its presence is optional. However, it is desirable.

Light-emitting layers typically have a host material (or a mixture of host materials), which is the primary component of the layer, and a light-emitting compound. In this case, a non-blue light-emitting compound emits light with a primary emission is greater than >500 nm. There may be a smaller amount of blue emission as well; desirably less than 20% of the maximum of the emission>500 nm. The drawback of blue emission in the non-blue layers is that it will not be intensified as efficiently as the non-blue wavelengths, since that emitter position was selected for maximum efficiency of the non-blue emission. Desirably, the non-blue light-emitting compound is phosphorescent as these have higher efficiency.

In many embodiments, it is desirable that the second non-blue LEL closest to the reflective layer primarily emits red light. Host materials and non-blue light-emitting materials such as R emitting phosphorescent compounds suitable for use in light-emitting layers such as 60 are well-known and commonly used. The choice of appropriate materials is not critical and any may be selected based on their performance and emission characteristics. When using phosphorescent emitters, it is sometimes necessary to confine the excitons generated by the phosphorescent emitter within the layer. Thus, exciton-blocking layers on either side, or both, of the phosphorescent LEL can be used if necessary. Such materials and their application are well known.

There is a second blue light-emitting layer 68 over the second non-blue light-emitting layer 60 and separated from it by ETL 62/CGL 64/HTL 66. In the embodiment of FIG. 5, the second blue LEL 68 is located on the opposite side of the second non-blue light-emitting layer 60 from the reflective surface. The midpoint of the second blue-light emitting layer 68 is located at a distance $L_3$ from the uppermost surface of the reflective surface. The ratio $L_3/L_0$ should be in the range of 0.52-0.64, or more preferably, 0.56-0.60.

A blue light-emitting layer will typically comprise a host material (or a mixture of host materials) and a blue light emitter. As previously mentioned, blue phosphorescent emitters would be very suitable, but currently known examples do not have adequate stability. Even if phosphorescent blue emitters with sufficient stability become available, their efficiency would likely be still lower than the efficiency of R and B phosphorescent emitters, so their availability alone might not solve the problem of insufficient blue light from a multimodal OLED microcavity. For this reason, fluorescent and TADF (thermally active delayed fluorescent) blue emitters are particularly useful for this invention. While B emission is generally <500 nm, preferred ranges for blue emission from the blue emitting material in a non-microcavity environment are 440-485 nm, more preferably 445-475 nm and most preferably 450-470 nm. These preferred wavelength ranges are governed by the blue emitters available, the photopic response of the eye (longer wavelengths appear brighter), and the color gamut requirements for the device (shorter wavelengths give a larger gamut). Host materials and fluorescent and TADF blue light-emitting materials suitable for use in light-emitting layers such as 68 and 84 are well-known and commonly used. The choice of appropriate materials is not critical and any may be selected based on their performance and emission characteristics.

Over the second blue-emitting layer 68 and separated from it by ETL 70/CGL 72/HTL 74 is a first non-blue light-emitting layer 76. In the embodiment of FIG. 5, the second blue light-emitting layer 68 is located between the second non-blue light-emitting layer 60 and the first non-blue light-emitting layer 76 and separated from each by HTL/CGL/ETL layers.

The first non-blue LEL 76 may be the same or different as the second non-blue LEL 60 (if present) in terms of either color emission or in terms of formulation. For example, LELs 60 and 76 may both emit R light or both emit G light where the internal compositions and materials may be the same or different. For example, they both may have the same G emission using identical compositions or both emit green light using different compositions so the maximum wavelength of G emission is not the same. Alternatively, LELs 60 and 76 may emit different colors of light; for example, one emits G light and the other emits R light. Other combinations of light emission are possible; for example, first LEL 76 emits G light and second LEL 60 emits Y light.

In many embodiments, it is desirable that the first non-blue LEL that is located between the first and second blue-light emitting layers, such as 76, primarily emits green light. More preferably, the first LEL 76 emits G and the second LEL 60 (when present) emits R light. Host materials and non-blue light-emitting materials such as G emitting phosphorescent compounds suitable for use in light-emitting layers such as 76 are well-known and commonly used. The choice of appropriate materials is not critical and any may be selected based on their performance and emission characteristics.

There is a first blue light-emitting layer 84 over the first non-blue light-emitting layer 76 and separated from it by ETL 78/CGL 80/HTL 82. In the embodiment of FIG. 5, the first blue LEL 84 is located on the opposite side of the second non-blue light-emitting layer 76 from the second blue LEL 68. In this arrangement, the second blue LEL 68 is closer to the reflective surface 52 and the first blue LEL 84 is further away from the reflective surface and closer to the semi-reflective second electrode, with a first non-blue LEL 76 between them.

Desirably, the ratio $L_1/L_0$ should be in the range of 0.30-0.40 to maximize the efficiency of both B LELs. More desirably, the ratio $L_1/L_0$ should be in the range of 0.32-0.38. The spacing between the first 84 and second 68 blue LELs is important because it maximizes the efficiency of both layers in a microcavity environment. According to theory, the two B LELs should be located at different anti-nodes (spaced apart by an odd multiple of a quarter wavelength; assuming a blue wavelength of 460 nm, an odd multiple of 115 nm) in order to maximum their individual efficiency. However, as previously discussed, the size of the microcavity is important in order to be able to accommodate LELs of different colors according to preferred positions. Thus, the appropriate spacing between the two B LELs will depend on the size of the microcavity, and so, will correspond to the ratio $L_1/L_0$.

The ratio $L_2/L_0$ should be in the range of 0.92-0.98, or more preferably, 0.93-0.96. This ensures that the first blue LEL is located near the electrode, which is desirable for high blue emission (see FIG. 2).

The first blue LEL 84 may be the same or different as the second blue LEL 68 in terms of either color emission or in terms of formulation. For example, they both may have the same B emission using identical compositions or both emit blue light using different compositions so that the maximum wavelength or half-bandwidth of B emission is not the same.

In many embodiments, it is desirable that the first and second B LELs, 84, 68, have the same formulation and emit at the same maximum blue wavelength. As for second blue LEL 68, host materials and blue light-emitting materials such as fluorescent and TADF compounds suitable for use in light-emitting layers such as 84 are well-known and commonly used. The choice of appropriate materials is not critical and any may be selected based on their performance and emission characteristics.

Locating the first non-blue LEL 76 between the second and first blue-light emitting LELs 84, 68 is desirable since it allows for space to be conserved within the multimodal OLED microcavity. Locating a non-blue LEL, which emits light of much different wavelength from the blue LELs, between them can utilize that space effectively.

Although not shown in FIG. 5, there can optionally be an additional non-blue light emitting layer closer to the semi-reflective electrode than the first B LEL 84. This optional non-blue light-emitting layer can emit G, R or Y light as necessary. Such a layer may have any of the same formulations as previously described for the $1^{st}$ or $2^{nd}$ non-blue LELs. It is also possible that there are one or more additional blue light-emitting layers closer to the semi-reflective electrode than the first blue LEL 84. Such a layer may have any of the same formulations as previously described for the $1^{st}$ or $2^{nd}$ blue LELs.

The second electrode 90 is semi-transparent as well as semi-reflective: that is, it reflects part of the light and transmits the rest. The bottommost internal surface of the second electrode 90 defines a second side of the microcavity 95 whose physical distance is $L_0$. Desirably, the semi-transparent upper electrode 90 reflects at least 5%, and more desirably, at least 10% of the light emitted by the LELs in order to establish the microcavity effect.

The thickness of the semi-transparent $2^{nd}$ electrode is important since it controls the amount of reflected light and how much is transmitted. However, it cannot be too thin since then it may not be able to efficiently pass charge into the OLED or be subject to pinholes or other defects. A thickness of the upper electrode layer is desirably 100-200 Å, and more desirably 125-175 Å.

The upper electrode is desirably a thin layer of metal or metal alloy. Suitable metals include Ag, Mg, Al and Ca or alloys thereof. Of these, Ag is preferred because it has relatively low blue absorption. One problem of blue absorbance by the semi-transparent electrode is that many OLED materials absorb some visible light, particularly blue light, and every reflection within the microcavity removes some photons forever. As one example, a semi-transparent upper electrode of 125 Å Ag reflects 15% in blue (420 nm) and 39% in red (650 nm) and at 250 Å, Ag reflects 43% at 420 nm and 72% at 650 nm. A desirable alloy is Ag/Mg (ratio 9:1 to 1:9). In order to help with electron transport as well as stabilization, there may an adjacent layer of transparent metal oxide on the electrode surface such as ITO, InZnO or MoO$_3$. Alternatively, metal halides such as LiCl, organometallic oxides such as lithium quinolate, or other organic materials could be used.

There may be protective or spacing layers (not shown in FIG. 5) over the upper electrode to prevent damage during encapsulation.

Over the upper electrode 90 and any optional protective layers, if present, is deposited or placed encapsulation 92. At a minimum, the encapsulation should fully cover the light-emitting area on the top and sides and is in direct contact with the substrate. The encapsulation should be impervious to air and water penetration. It may be transparent or opaque. It should not be electrically conductive. It may be formed in-situ or added as a separate pre-formed sheet along with provisions for sealing the side edges.

An example of in-situ formation would be thin-film encapsulation. Thin-film encapsulation involves the deposition of multiple layers with alternative layers of inorganic materials and polymeric layers until the desired degree of protection is achieved. Formulations and methods to form thin-film encapsulation are well known and any can be used as desired.

Alternatively, encapsulation may be provided using a pre-formed sheet or cover slip which is attached over at least sealing area and enclosed area. The pre-formed sheet may be rigid or flexible. It could be made of glass (including flexible glass), metal or organic/inorganic barrier layers. It should have a thermal expansion coefficient that is close to the substrate to achieve a more robust connection. Pre-formed encapsulation sheets may need to be attached over the sealing area using air and water proof adhesives such as silicon or epoxy adhesives or by thermal means such as ultrasonic welding or glass frit welding, which may require additional sealants such as solder or glass frit. The side and bottom edges of the cover slip can be specially designed to have better fit to the sealing area or promote a better seal. The cover slip and sealing area may be designed together so that they fit or lock partially in place before the seal is formed. Moreover, the cover slip may be pretreated to promote better adhesion to the sealing area.

The most desired embodiment as shown in FIG. 5 can be designated (in terms of LEL order within the microcavity) as a top-emitting device: substrate/reflective layer/anode ($1^{st}$ electrode)/R ($2^{nd}$ non-blue LEL)/BLEL2 ($2^{nd}$ B LEL)/G ($1^{st}$ non-blue LEL)/BLEL1 ($1^{st}$ B LEL)/cathode ($2^{nd}$ electrode) device. However, other top-emitting embodiments would include (between the $1^{st}$ and $2^{nd}$ electrodes): G/BLEL2/R/BLEL1; Y/BLEL2/G/BLEL1; G/BLEL2/Y/BLEL1; G/BLEL2/G/BLEL1; R/BLEL2/R/BLEL1; Y/BLEL2/Y/BLEL1; Y/BLEL2/R/BLEL1; R/BLEL2/Y/BLEL1; BLEL2/G/BLEL1; BLEL2/R/BLEL1; BLEL2/Y BLEL1; Y/BLEL2/BLEL1; and BLEL2/BLEL1/Y.

However, as shown in FIG. 5, when the first electrode of the OLED microcavity is not segmented so the device is a large area light emitter, the OLED microcavity can also be a bottom emitter; that is, light is emitted through the substrate. In some embodiments, it is desirable that the $1^{st}$ electrode be the semi-transparent electrode (particularly a cathode) and the $2^{nd}$ electrode (particularly an anode), where the reflective surface is over the top of the OLED microcavity. Those skilled in the art will understand that the order of hole- and electron-transporting layers will necessarily be reversed for such an arrangement. A desirable bottom emitting device according to the invention can be designated (in terms of LEL order within the microcavity) as: (transparent) substrate/cathode ($2^{nd}$ electrode)/BLEL1 (1st B LEL)/G ($1^{st}$ non-blue LEL)/BLEL2 ($2^{nd}$ B LEL)/R ($2^{nd}$ non-blue LEL)/anode ($1^{st}$ electrode)/reflective layer device. However, other bottom-emitting embodiments would include (between the $1^{st}$ and $2^{nd}$ electrodes): BLEL1/R/BLEL2/G; BLEL1/G/BLEL2/Y; BLEL1/Y/BLEL2/G; BLEL1/R/BLEL2/Y; BLEL1/Y/BLEL2/R; R/BLEL1/R/BLEL2; G/BLEL1/G/BLEL2; Y/BLEL1/Y/BLEL2; BLEL1/G/BLEL2; BLEL1/R/BLEL2; Y/BLEL2/BLEL1; BLEL2/BLEL1/Y; and BLEL1/Y/BLEL2.

Figure 6:
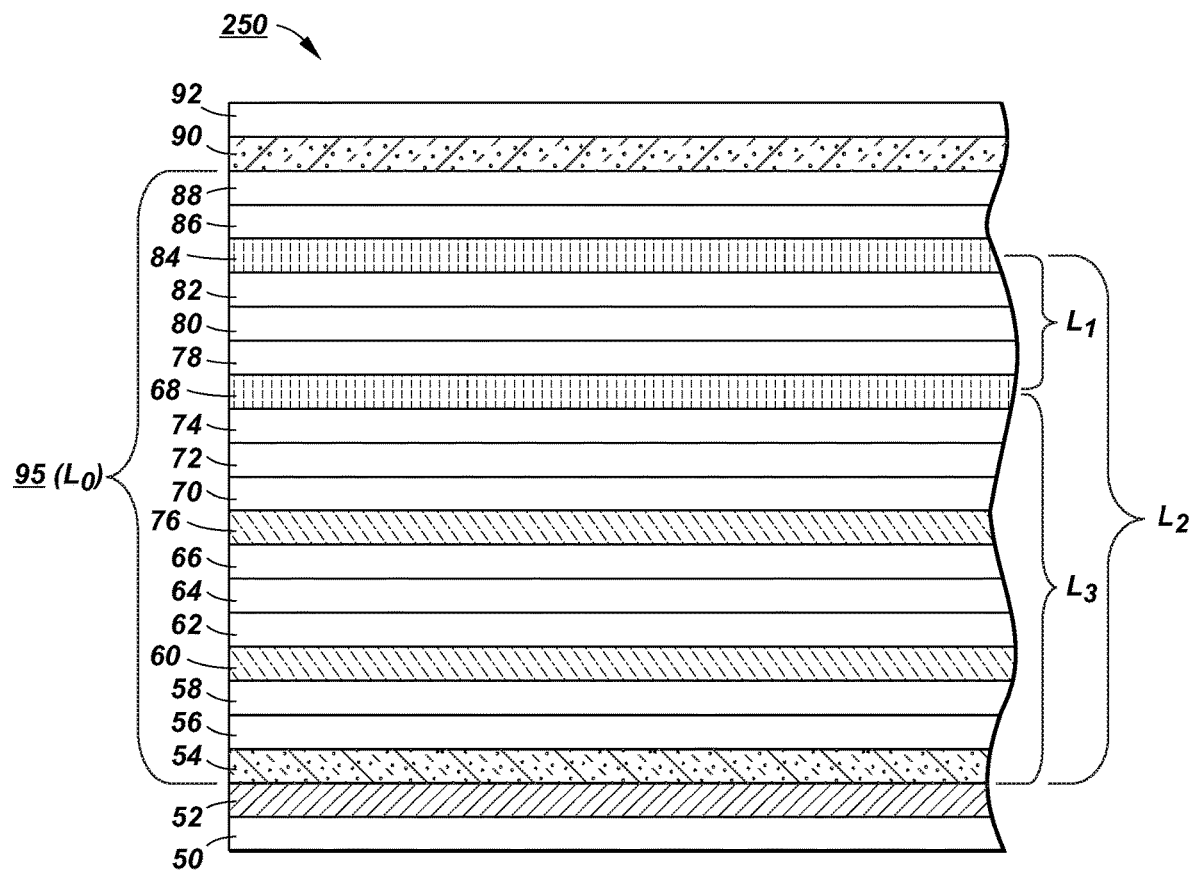
FIG. 6 shows a cross-section of a second OLED microcavity device 250.

FIG. 6 illustrates a cross-section of one embodiment of a top-emitting OLED microcavity device 250 according to the invention. It is similar to the embodiment shown in FIG. 5 except that the relative positions of the second blue light-emitting layer 68 and the first non-blue-light emitting layer 76 are interchanged. Otherwise, there are no other changes. In this embodiment, the two blue-light emitting layers are not separated by a non-light emitting layer. However, the distance $L_1$ between the midpoint of the second blue-light emitting layer 68 and the midpoint of the first blue-light emitting layer 84 is adjusted to be the same as in the embodiment of FIG. 5 so that the ratio $L_1/L_0$ is the same in both embodiments. For example, this adjustment can be made by increasing the thickness of the hole-transport layer 82 by the appropriate amount to increase $L_1$ and decreasing the thickness of hole transport layers 66, 58 by the same total amount to decrease $L_3$ in order to maintain a constant microcavity distance $L_0$. $L_2$ is the same in both 200 and 250.

Figure 7:
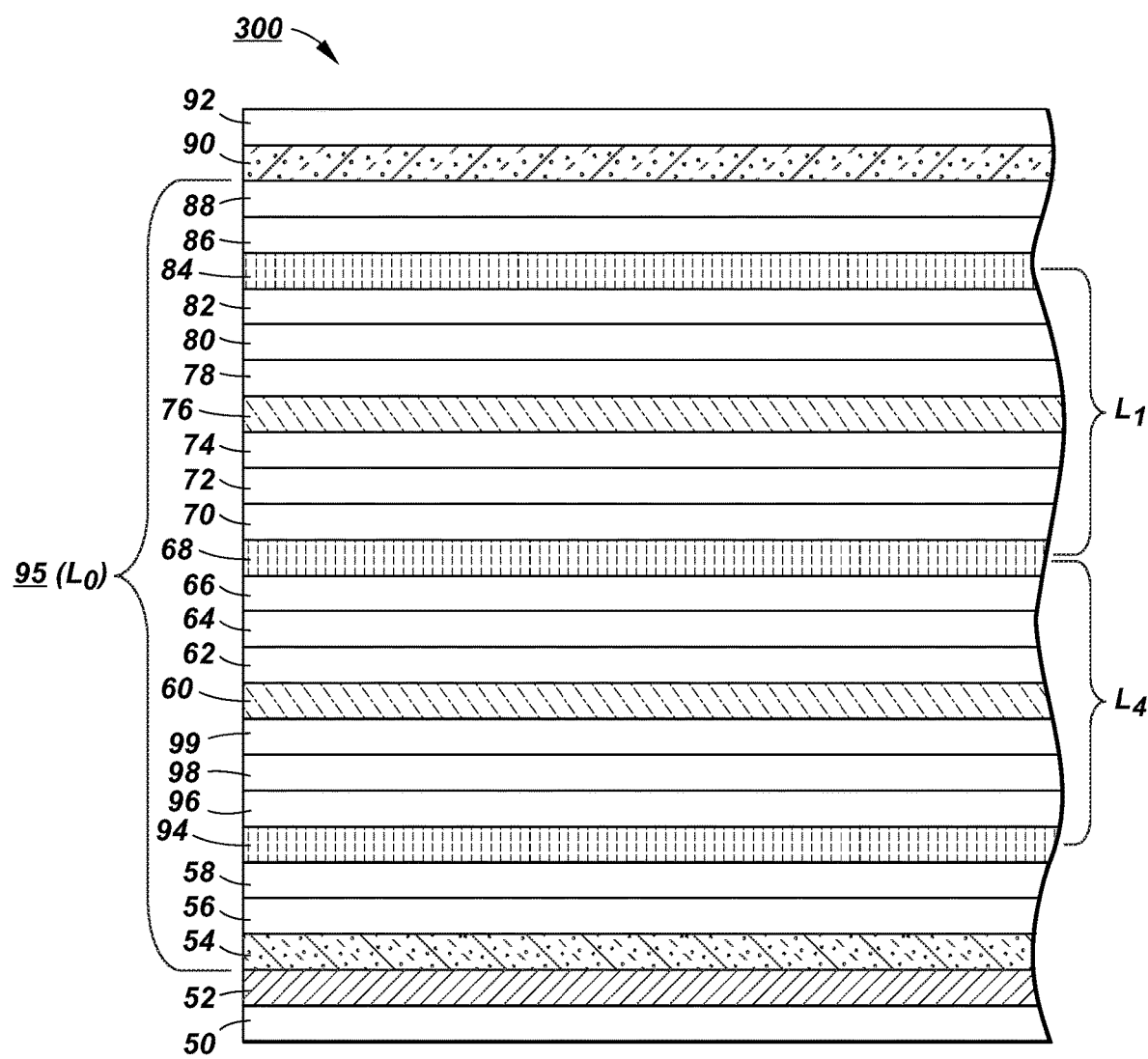
FIG. 7 shows a cross-section of a third OLED microcavity device 300.

An OLED microcavity device 300 (similar to FIG. 5) is shown in FIG. 7. In this embodiment, an extra HTL 99/CGL 98/ETL 96/a third blue light-emitting layer 94 stack is added between layers 58 (HTL) and 60 ($2^{nd}$ non-blue LEL). The other layers are unchanged and the additional HTL, CGL, ETL and $3^{rd}$ blue LEL may be formulated in the same way as described for similar layers in FIG. 5. This top-emitting OLED microcavity has three blue LELs with two non-blue LELs. The first non-blue LEL 76 is located between the second 68 and first 84 blue LELs and the second non-blue LEL 60 is located between $2^{nd}$ blue LEL 68 and $3^{rd}$ blue LEL 94. As described for OLED microcavity 200, the positions of the G and R LELs may be interchanged or changed to Y LELs. In addition, OLED microcavity device 300 can be reformulated as bottom-emitting embodiments as described for OLED microcavity device 200. In other embodiments, the $3^{rd}$ blue LEL can be located between the second non-blue-emitting layer (if present) and the second blue-light emitting layer. However, in those embodiments where there is no $2^{nd}$ non-blue LEL, the second blue LEL and third blue LEL will not be separated by a light-emitting layer.

$L_4$ is the physical distance between the midpoint of the second blue-light emitting layer 68 and the midpoint of the third blue-light emitting layer 94. Desirably, $L_4/L_0$ is in the range of 0.30-0.40 and more preferably, 0.32-0.38.

Figure 8:
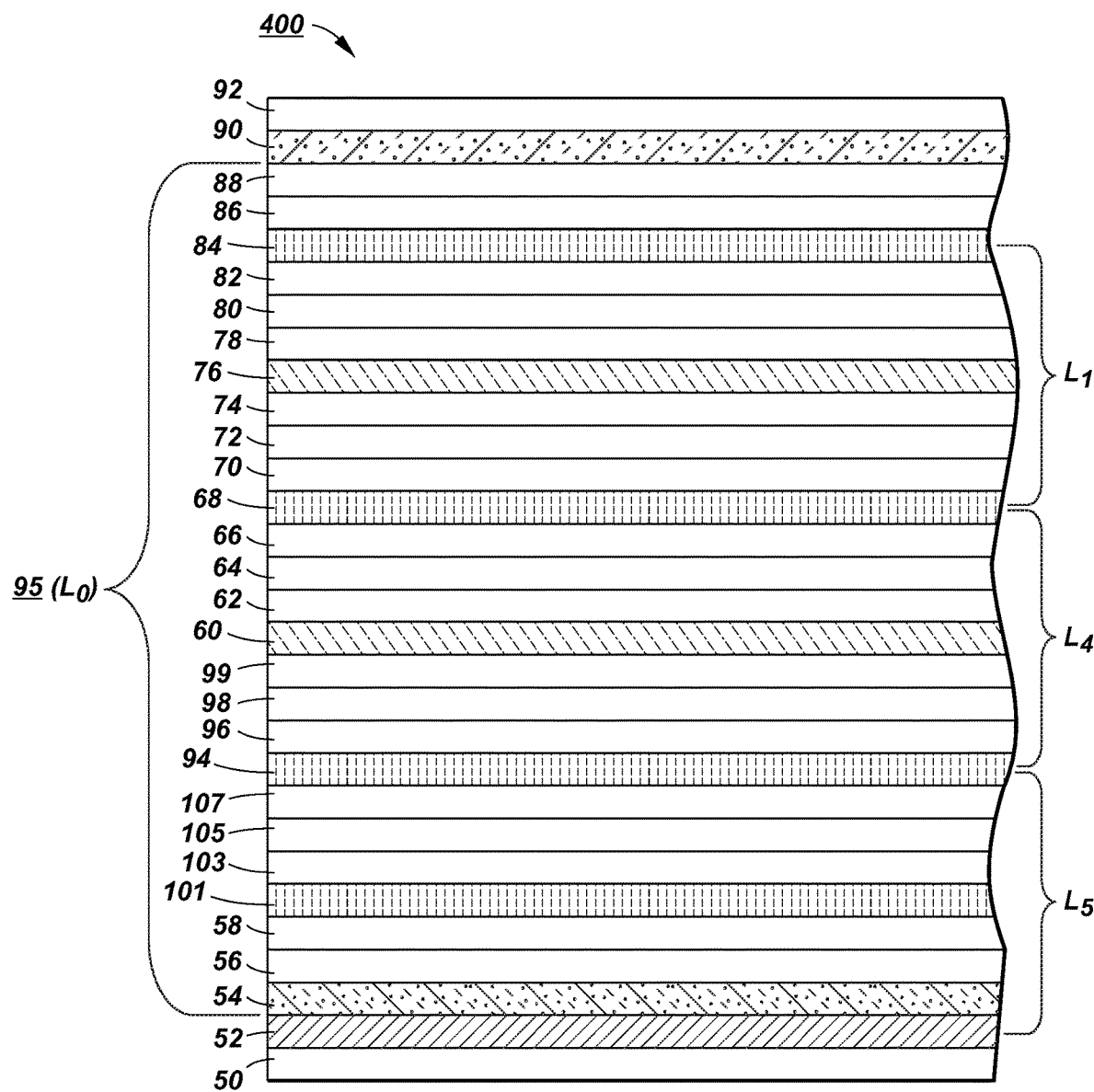
FIG. 8 shows a cross-section of a fourth OLED microcavity device 400.

An OLED microcavity device 400 (similar to FIG. 7) is shown in FIG. 8. In this embodiment, an extra HTL 107/CGL 105/ETL 103/a fourth blue light-emitting layer 101 stack is added between layers 58 (HTL) and 94 ($3^{rd}$ B LEL). The other layers are unchanged and the additional HTL, CGL, ETL and $4^{th}$ blue LEL may be formulated in the same way as described for similar layers in FIG. 5. This top-emitting OLED microcavity has four blue LELs with two non-blue LELs where the first non-blue LEL 76 is located between the second 68 and first 84 blue LELs and the second non-blue LEL 60 is located between $2^{nd}$ blue LEL 68 and $3^{rd}$ blue LEL 94. There is no non-blue LEL between $3^{rd}$ B LEL (99) and $4^{th}$ B LEL (101) as shown in this embodiment. However, a third non-blue LEL may optionally be added between $3^{rd}$ B LEL and $4^{th}$ B LEL. For example, an OLED microcavity could have the following structure: substrate/ reflective layer/BLEL4/Y/BLEL3/R/BLEL2/G/BLEL1/cathode. As described for OLED microcavity device 300, the positions of the G and R LELs may be interchanged or changed to Y LELs in OLED microcavity device 400. In addition, OLED microcavity device 400 can be reformulated as bottom-emitting embodiments as described for OLED microcavity device 200.

$L_5$ is the physical distance between the midpoint of the third blue-light emitting layer 94 and the midpoint of the fourth blue-light emitting layer 101. Desirably, $L_5/L_0$ is in the range of 0.10-0.20 and more preferably, 0.13-0.16.

Because of the number of stacked light-emitting layers and the need to minimize voltage in an OLED with multiple light-emitting layers, it is often desirable to include charge-generation layers (CGL), also sometimes referred to as connector or intermediate layers, to minimize voltage increase when using multiple LEL stacks as in the embodiments of FIGS. 5-8. In particular, it is desirable that a CGL is located between each light-emitting layer within the stack, and more desirable that the CGL has a HTL on one side and an ETL on the opposite side. It is generally not necessary to locate a CGL between a light-emitting layer and an electrode, but in special circumstances such an application of a CGL could be advantaged.

A charge-generation layer (which may be composed of more than one layer) has the ability to generate both holes and electrons. Often, a CGL has a n-layer (which may be doped with an electron-generating n-dopant) that can generate electrons when subjected to an electrical bias and a p-layer (which may be doped with an electron-poor p-dopant) that can accept electrons. In some instances, the n-layer and p-layer may be separated by a thin intermediate layer. Often, the CGL is arranged so that the n-layer is closer to the anode and the p-layer is closer to the cathode.

A desirable formulation for a CGL has three layers; an electron-transport material doped with a n-dopant (for example, Li), a thin intermediate layer of the same electron-transport material, and a hole-transport material doped with a p-dopant. Suitable electron-transport and hole-transport materials, along with n-dopants and p-dopants suitable for use in a CGLs such as 64, 72 and 80 are well-known and commonly used. The materials may be organic or inorganic. The choice of appropriate materials is not critical and any may be selected based on their performance.

The thickness of the CGL should desirably be in the range of 200-450 Å. In many instances, the CGL will have an ETL on the anode side and a HTL on its cathode side to help improve charge transport and help separate the charge-generating dopants (if present) from the LEL.

Modelling Results

The aim of the invention is to increase the amount of blue emission in a multimodal OLED microcavity where the microcavity has a single and constant thickness across the entire light-emitting area. Not only is the relative distance of the B LELs to each other as well as from the reflector layer within the microcavity important to achieve high blue efficiency, but other factors such as the relative order of the LELs and the nature of the semi-transparent electrode can also be important in maximizing blue emission.

The overall thickness of the microcavity will have an effect on the wavelength of the emitted light. As shown in FIG. 1, OLED emitters tend to be relatively broad with significant amounts of emission at wavelengths near the maximum wavelength. However, in a microcavity environment, the wavelength of the maximum emission may be different from that in a non-microcavity. This is because the microcavity effect operates at every wavelength and so, depending on the size of the microcavity, emission at some wavelengths is intensified but decreased at other wavelengths. This can result in shifts in the wavelength of maximum emission as well as cause changes in the shape of the overall spectra. Since a single multimodal microcavity cannot be optimized for each color of light individually, some shifts in the wavelength of maximum emission for each color can be expected.

Table A illustrates the modelled effect of microcavity thickness on wavelength of intensified emission.

TABLE A

| | Predicted Intensified Wavelengths | | | |
|---|---|---|---|---|
| Microcavity Length[1] | Violet[2] | Blue[2] | Green[2] | Red[2] |
| 6650 | 384 | 437 | 506 | 619 |
| 6750 | 389 | 442 | 512 | 627 |
| 6850 | 394 | 447 | 518 | 636 |
| 6950 | 398 | 452 | 525 | 643 |
| 7050 | 403 | 456 | 532 | 652 |
| 7150 | 408 | 461 | 538 | 659 |
| 7250 | 412 | 466 | 544 | 668 |

[1] in Å
[2] in nm; refers to color region

In this size range of microcavities, the preferred blue, green and red wavelengths (as shown in FIG. 1) are intensified but not at less desirable wavelengths such as 480 nm and 580 nm, which are not near the display primary saturated color wavelengths. As the microcavity length increases, the peaks of the intensified wavelength will shift continuously to longer wavelengths and there may be additional peaks. Based on modelling, there are two different particularly suitable ranges of microcavity that will provide intensification of the desired wavelengths of R, G, and B light; the first desirable range is about 6500-7800 Å and the second. desirable range is about 8000-9000 Å.

Thus, in order to maximize overall efficiency, it is necessary to first determine the appropriate cavity length where the peaks of intensified wavelength are in the desired R, G and B ranges, and then determine the positions of the various emitters within the microcavity.

The predicted optimum locations for the maximum intensification of blue LELs in a 6950 Å microcavity are shown in Table B. Since the LELs have a finite thickness, the locations are based on the distance of the midpoint of the LELs to the uppermost surface of the reflective layer. In the calculations, physical distances are used to describe the thickness of the multimodal microcavity and relative locations of the LELs. Note that the quarter-wavelength of a typical blue light emitter (460 nm) is about 115 nm.

TABLE B

| Predicted Optimum Locations for Blue LELs in 6950 Å Microcavity | | | | | | |
|---|---|---|---|---|---|---|
| | Node 1 | Node 2 | Node 3 | Node 4 | Node 5 | Node 6 |
| Location[1] | 29 | 143 | 276 | 402 | 525 | 647 |
| Location[2] | 666 | 552 | 419 | 293 | 170 | 48 |
| Intensity[3] | 21.0 | 20.4 | 22.1 | 28.4 | 32.7 | 36.6 |

[1] in nm from the semi-transparent surface
[2] in nm from the reflective surface
[3] Normalized As shown in Table B, the calculated locations of maximum intensification are all about 121-125 nm apart with a ratio of (distance between nodes)/(microcavity length) of between 0.17-0.18).

The predicted optimum locations for the maximum intensification of blue LELs in a 8450 Å microcavity are shown in Table C.

TABLE C

Predicted Optimum Locations
for Blue LELs in 8450 Å Microcavity

|  | Node 1 | Node 2 | Node 3 | Node 4 | Node 5 | Node 6 | Node 7 |
|---|---|---|---|---|---|---|---|
| Location[1] | 34 | 148 | 264 | 385 | 556 | 677 | 798 |
| Location[2] | 811 | 687 | 581 | 460 | 289 | 168 | 47 |
| Intensity[3] | 27.0 | 27.3 | 27.0 | 24.1 | 28.3 | 34.5 | 40.7 |

[1]in nm from the semi-transparent surface
[2]in nm from the reflective surface
[3]Normalized As shown in Table C, the calculated locations of maximum intensification are all about 114-121 nm apart with a ratio of (distance between nodes)/(microcavity length) of between 0.13-0.14).

The following OLED microcavity structures with two or more B LELs were modelled to determine the optimum locations for the B LELs within the microcavity. These calculations are based on the $\lambda_{max}$ emission (non-microcavity) of B=456 nm, G=540 nm, and R=620 nm. The thickness of the microcavity (between the uppermost reflecting surface and the bottommost surface of the semi-transparent electrode) was 6950 Å, the LEL thicknesses were all 200 Å, and there were non-light emitting spacing layers between each LELs in all cases. The devices were bottom-emitting. Of these, Model Formats B and D have B LELs separated by at least one non-blue LEL; Model Formats A and C have adjacent B LELs.
Model Format A: B2 LEL/B1 LEL/R LEL/G LEL
Model Format B: B2 LEL/G LEL/R LEL/B1 LEL
Model Format C: G LEL/B2 LEL/B1 LEL/R LEL
Model Format D: R LEL/B2 LEL/G LEL/B1 LEL The calculated results for blue intensity are tabulated in Table D.

TABLE D

Calculated B Intensities for Model B LEL Locations

| Model Format | B1 ↔ B2[1] | Blue Intensity |
|---|---|---|
| A | 114 (0.16) | 87.1 |
| B | 248 (0.36) | 82.7 |
| C | 370 (0.53) | 80.9 |
| D | 215 (0.31) | 71.8 |

[1]Distance in nm between midpoints of Blue LELs; (Distance between LELs/695 nm microcavity distance)

Table D, like Tables B and C, indicates that the optimum distance between blue-light emitting layers should be about 120 nm or about 0.16 of the microcavity distance. Further increases (i.e. half-wavelength or greater but not an odd multiple of the quarter-wavelength) in the distance between the blue-light emitting layers is predicted to give worse results. In this regard, examples with an intermediate non-blue-LEL between the blue LELs (Formats B and D) seem to be similar to Format C where there is no non-blue LEL between the two blue LELs.

Experimental Results

In the following examples, the numbers before each material (e.g. 130 ITO) are physical layer thicknesses in Angstroms unless otherwise noted. All devices were encapsulated after deposition of the cathode using the same procedures. In OLED Series A and B, all examples have a microcavity thickness between the reflective surface and the semi-transparent cathode of 7750 Å.
OLED Series A
Example A1 (Comparative): An OLED microcavity device with a conventional R/G/BLEL1 internal structure was prepared as follows on a glass substrate.
Layer 1 (Reflective Surface): 1000 Al
Layer 2 (Anode): 130 ITO
Layer 3 (HIL): 250 Hole Transporting Material (HTM) A with 8% p-Dopant A
Layer 4 (HTL): 2450 HTM A
Layer 5 (Red LEL): 200 Mixed Host A (9:1 ratio)/B with 3% Phosphorescent Red Dopant 10% Stabilizer
Layer 6 (ETL): 100 Electron-Transporting Material (ETM) A
Layer 7 (Charge Generation Layer (CGL) 1): 3 layers (total thickness 370) consisting of 100 ETM B with 2% Li/20 ETM B/250 HTM A with 10% p-Dopant A
Layer 8 (HTL): 2050 HTM A
Layer 9 (Green LEL): 200 Host A+10% Phosphorescent Green Dopant
Layer 10: ETL: 100 ETM A
Layer 11 (CGL2): 370 (same formulation as CGL1 in Layer 7)
Layer 12 (HTM): 930 HTM A
Layer 13 (Blue LEL1): 200 Host C with 4% Fluorescent Blue Dopant A
Layer 14 (ETL): 300 ETM A
Layer 15 (EIL): 100 ETM B with 2% Li
Layer 16 (Semi-transparent Cathode); 125 co-deposited Ag (75%) and Mg (25%)

In Example A1, the midpoint of BLEL1 is located 7250 Å from the front interior surface of the reflective layer and 500 Å from the front interior surface of the semi-transparent cathode.

Example A2 (Inventive): An OLED microcavity device with an inventive R/BLEL2/G/BLEL1 internal structure was prepared in the same manner as for comparative Example A1 except for the following changes:
Layer 8 (HTL): 2050 HTM A was reduced to a thickness of 950 and the following layers of an additional B light-emitting layer along with a CGL3 were added prior to deposition of Layer 9; and the following layers were added (in order) over Layer 8 and before Layer 9:
Layer 8A (Blue LEL 2): 200 (same formulation as Layer 13)
Layer 8B (ETL) 100 ETM A
Layer 8C (CGL3): 370 (same formulation as CGL1)
Layer 8D (HTL): 430 HTM A Blue LEL 2 is located between the green LEL and the red LEL and separated from each by ETL/CGL/HTL layers. The distance of the midpoint of BLEL1 to the reflective surface is 7250 Å, the distance of the midpoint of BLEL2 to the reflective surface is 4550 Å, and the distance between the midpoint of BLEL1 and the midpoint of BLEL2 is 2700 Å.

Example A3 (Inventive): An OLED microcavity device similar to inventive Example A2 (R/BLEL2/G/BLEL1) was prepared in the same manner as Example A2 except that the thickness of Layer 8 was increased to 1150 (from 950) and the thickness of Layer 8D was decreased to 230 (from 430). This effectively moves the midpoint of BLEL2 200 Å further away from the reflective surface and 200 Å closer to BLEL1 and the cathode. In Example 3, the distances of the midpoint of BLEL2 to the reflective surface is 4750 Å, the distance between the midpoint of BLEL 2 to the semi-transparent cathode is 3000 Å, and the distance between the midpoint of BLEL1 and the midpoint of BLEL2 is also decreased to 2500 Å from 2700 Å.

Example A4 (Inventive): An OLED microcavity device similar to inventive Example A2 (R/BLEL2/G/BLEL1) was prepared in the same manner except that the thickness of Layer 8 was decreased to 750 (from 950) and the thickness of Layer 8D was increased to 630 (from 430). This effectively moves the midpoint of BLEL2 200 Å closer from the reflective surface and 200 Å further away from BLEL1 and the cathode. In Example A4, the distances of the midpoint of BLEL2 to the reflective surface is 4350 Å, the distance between the midpoint of BLEL2 to the semi-transparent cathode is 3400 Å, and the distance between the midpoint of BLEL1 and the midpoint of BLEL2 is also increased to 2900 Å from 2700 Å.

Results for OLED Series A can be found in Tables 1 and 2.

TABLE 1

Performance Data of OLED Series A

| Example | Voltage | Luminance Efficiency (cd/A)[1] | CIEx | CIEy | Maximum Blue λ (nm) | Intensity at max B λ |
|---|---|---|---|---|---|---|
| A1 (Comp) | 9.2 | 70.9 | 0.34 | 0.46 | 462 | 0.113 |
| A2 (Inv) | 12.4 | 73.5 | 0.30 | 0.32 | 462 | 0.187 |
| A3 (Inv) | 12.3 | 56.0 | 0.30 | 0.39 | 462 | 0.162 |
| A4 (Inv) | 12.5 | 69.3 | 0.32 | 0.43 | 462 | 0.141 |

[1]Measured at 10 mA/cm$^2$

Figure 9:
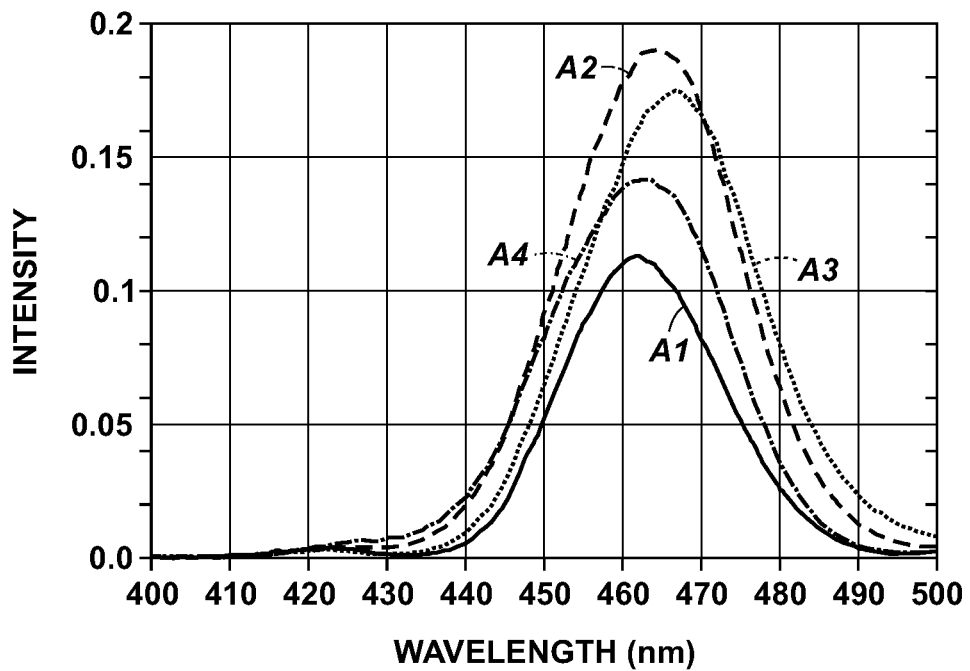
FIG. 9 shows spectra for Experimental Examples A1-A4 in the blue emission region.

Inventive examples A2-A4 demonstrate that the addition of BLEL1, located on the opposite side of the G LEL from BLEL2, causes more blue light to be emitted than in comparative example A1, as shown by improved CIEx, CIEy values (closer to 0.33, 0.33) and increased blue emission intensity, as shown in FIG. 9.

Table 2 shows the distance $L_1$ between BLEL1 and BLEL2 as well as the ratio $L_1/L0$

TABLE 2

Distance between B Light-emitting Layers within Microcavity for OLED Series A

| | Distance between B LELs | |
|---|---|---|
| Example | BLEL1 ↔ BLEL2[1] | $L_1/L_0$ |
| A1 (Comp) | — | |
| A2 (Inv) | 270 | 0.35 |
| A3 (Inv) | 250 | 0.32 |
| A4 (Inv) | 290 | 0.37 |

[1]Distance (in nm), measured from midpoint of LELs

Tables 1 and 2 also demonstrate that the optimum location of BLEL1 and BLEL2 within the microcavity relative to the reflective layer is unexpectedly very different from that according to microcavity theory and yet, increased blue emission is still observed, as shown in FIG. 9. For example, Inventive Examples A2-A4 have a similar structure to Model Format D with a non-blue LEL between two B LELs, but as shown in Table D, this distance between two B LELs was not predicted by microcavity theory to be optimum.

OLED Series B

Example B1: An OLED microcavity device (R/BLEL2/G/BLEL1) was prepared in the same manner as for inventive Example A2 except that the thickness of the cathode (layer 16) was increased to 145 from 125.

Example B2: An OLED microcavity device with an inventive BLEL3/R/BLEL2/G/BLEL1 internal structure was prepared in the same manner as for inventive Example B1 except for the following changes:
Layer 4 (HTL): 2450 HTM A was reduced to a thickness of 1240 and the following layers of an additional B light-emitting layer along with a CGL4 were added prior to deposition of Layer 5:
Layer 4A (Blue LEL 3): 200 (same formulation as Layer 13)
Layer 4B (ETL) 200 ETM A
Layer 4C (CGL4): 370 (same formulation as CGL1)
Layer 4D (HTL): 260 HTM A
and the following layers were modified:
Layer 8 (HTL): The thickness increased from 950 to 1070
Layer 8B (ETL): thickness increased to 200 from 100
Layer 8D (HTL): thickness decreased to 310 from 430
Layer 12 (HTM): thickness decreased to 910 from 930
Layer 14 (ETL): thickness reduced to 200 from 300

In Example B2, the midpoint of BLEL1 is located 7350 Å from the front interior surface of the reflective layer and 400 Å from the front interior surface of the semi-transparent cathode, the midpoint of BLEL2 is located 4590 Å from the front interior surface of the reflective layer and 3160 Å from the front interior surface of the semi-transparent cathode, the distance between the midpoint of BLEL1 and the midpoint of BLEL2 is 2760 Å, the distance between the midpoint of BLEL3 is located 1720 Å from the front interior surface of the reflective layer and 6030 Å from the front interior surface of the semi-transparent cathode, and the distance between the midpoint of BLEL2 and the midpoint of BLEL3 is 2870 Å.

Results for OLED Series B can be found in Tables 3 and 4.

TABLE 3

Performance Data of OLED Series B

| Example | Voltage | Luminance Efficiency (cd/A)[1] | CIEx | CIEy | Maximum Blue λ (nm) | Intensity at max B λ |
|---|---|---|---|---|---|---|
| B1 (Inv) | 12.3 | 65.3 | 0.33 | 0.47 | 476 | 0.118 |
| B2 (Inv) | 15.7 | 66.9 | 0.33 | 0.41 | 468 | 0.200 |

[1]Measured at 10 mA/cm$^2$

TABLE 4

Distance between B Light-emitting Layers within Microcavity for OLED Series B

| | Distance between B LELs | | | |
|---|---|---|---|---|
| Example | BLEL1 ↔ BLEL2[1] | $L_1/L_0$ | BLEL2 ↔ BLEL3[1] | $L_4/L_0$ |
| B1 (Inv) | 270 | 0.35 | | |
| B2 (Inv) | 276 | 0.36 | 2870 | 0.37 |

[1]Distance (in nm), measured from midpoint of LELs

Figure 10:
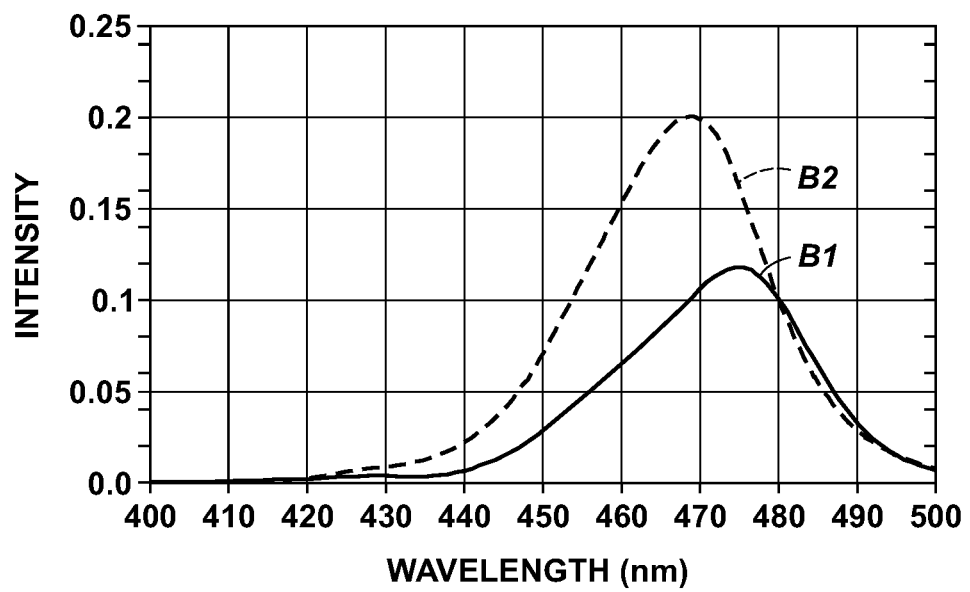
FIG. 10 shows spectra for Experimental Examples B1 and B2 in the blue emission region.

Inventive example B1 has a R/BLEL2/G/BLEL1 structure similar to inventive Example A2. Inventive Example B2 has a BLEL3/R/BLEL2/G/BLEL1 structure. The additional B LEL, located between the R LEL and the reflective surface, shows further improvements in CIEx, CIEy values (closer to 0.33, 0.33) and increased blue emission intensity, as shown in FIG. 10.

Tables 3 and 4 also demonstrate that the optimum location of BLEL1, BLEL2 and BLEL3 within the microcavity relative to the reflective layer is unexpectedly very different from that according to microcavity theory and yet, increased blue emission is still observed. For example, Inventive Example B2 have a similar structure to Model Format E with a non-blue LEL between two B LELs and a $3^{rd}$ B LEL closest to the reflective surface, but as shown in Table D, this distance between two B LELs was not predicted to be optimum.

OLED Series C

Example C1: An OLED microcavity device (BLEL3/R/BLEL2/G/BLEL1) was prepared in the same manner as for inventive Example B2.

Example C2: An OLED microcavity device (BLEL4/BLEL3/R/BLEL2/G/BLEL1) was prepared in the same manner as for inventive Example C1 except the following layers of an additional B light-emitting layer along with a CGL4 were added prior to deposition of Layer 4A:
Layer 4A' (Blue LEL 4): 200 (same formulation as Layer 13)
Layer 4B' (ETL) 200 ETM A
Layer 4C' (CGL4): 370 (same formulation as CGL1)
Layer 4D' (HTL): 370 HTM A Example C3: An OLED microcavity device (B4/B3/R/B2/G/B1) was prepared in the same manner as for inventive Example C2 except the following changes:
Layer 4D (HTL): The thickness was decreased from 260 to 210
Layer 8 (HTL): The thickness was decreased from 1070 to 1020
Layer 8D (HTL): The thickness was decreased from 310 to 260
Layer 12 (HTL): The thickness was decreased from 910 to 860

Example C4: An OLED microcavity device (B4/B3/R/B2/G/B1) was prepared in the same manner as for inventive Example C2 except the following changes:
Layer 4D (HTL): The thickness was decreased from 260 to 160
Layer 8 (HTL): The thickness was decreased from 1070 to 970
Layer 8D (HTL): The thickness was decreased from 310 to 210
Layer 12 (HTL): The thickness was decreased from 910 to 810

Example C5: An OLED microcavity device (BLEL4/BLEL3/R/BLEL2/G/BLEL1) was prepared in the same manner as for inventive Example C2 except the thickness of Layer 4 (HTL) was increased from 100 to 300.

Example C6: An OLED microcavity device (BLEL4/BLEL3/R/BLEL2/G/BLEL1) was prepared in the same manner as for inventive Example C2 except the thickness of Layer 4 (HTL) was increased from 100 to 500.

Results for OLED Series C can be found in Tables 5, 6, and 7.

TABLE 5

Performance Data of OLED Series B

| Example | Voltage | Luminance Efficiency (cd/A)[1] | CIEx | CIEy | Maximum Blue λ (nm) | Intensity at max B λ |
|---|---|---|---|---|---|---|
| C1 (Inv) | 16.14 | 59.93 | 0.36 | 0.48 | 473 | 0.089 |
| C2 (Inv) | 19.19 | 60.88 | 0.34 | 0.42 | 477 | 0.174 |
| C3 (Inv) | 19.53 | 67.52 | 0.31 | 0.40 | 464 | 0.247 |
| C4 (Inv) | 18.96 | 56.29 | 0.32 | 0.35 | 482 | 0.181 |

TABLE 5-continued

Performance Data of OLED Series B

| Example | Voltage | Luminance Efficiency (cd/A)[1] | CIEx | CIEy | Maximum Blue λ (nm) | Intensity at max B λ |
|---|---|---|---|---|---|---|
| C5 (Inv) | 19.03 | 59.14 | 0.36 | 0.42 | 458 | 0.294 |
| C6 (Inv) | 19.15 | 47.06 | 0.43 | 0.41 | 490 | 0.133 |

[1]Measured at 10 mA/cm$^2$

TABLE 6

Distance of B Light-emitting Layers within Microcavity for OLED Series C[1]

| | C1 | C2 | C3 | C4 | C5 | C6 |
|---|---|---|---|---|---|---|
| MC Thickness | 7750 | 7750 | 7550 | 7350 | 7950 | 8150 |
| B1 ↔ B2 ($L_1$) | 2760 | 2760 | 2660 | 2560 | 2760 | 2760 |
| B1 ↔ B3 | 5630 | 5630 | 5430 | 5230 | 5630 | 5630 |
| B2 ↔ B4 | 2870 | 2870 | 2770 | 2670 | 2870 | 2870 |
| B1 ↔ B4 | | 6770 | 6570 | 6370 | 6770 | 6770 |
| B2 ↔ B3 ($L_4$) | 4010 | 3910 | 3810 | 4010 | 4010 | |
| B3 ↔ B4 ($L_5$) | | 1140 | 1140 | 1140 | 1140 | 1140 |

[1]In Å, measured from midpoint of LEL

TABLE 7

Relative Distances of B LELs within Microcavity for OLED Series C

| | Relative Distance between B LELs | | | | | |
|---|---|---|---|---|---|---|
| | C1 | C2 | C3 | C4 | C5 | C6 |
| $L_1/L_0$ | 0.36 | 0.36 | 0.35 | 0.35 | 0.35 | 0.34 |
| $L_4/L_5$ | 0.37 | 0.37 | 0.37 | 0.36 | 0.36 | 0.35 |
| $L_5/L_0$ | | 0.15 | 0.15 | 0.16 | 0.14 | 0.14 |
| B1 ↔ B3/$L_0$ | 0.73 | 0.73 | 0.72 | 0.71 | 0.71 | 0.69 |
| B1 ↔ B4/$L_0$ | | 0.87 | 0.87 | 0.87 | 0.85 | 0.83 |
| B2 ↔ B4/$L_0$ | | 0.52 | 0.52 | 0.52 | 0.50 | 0.49 |

Figure 11:
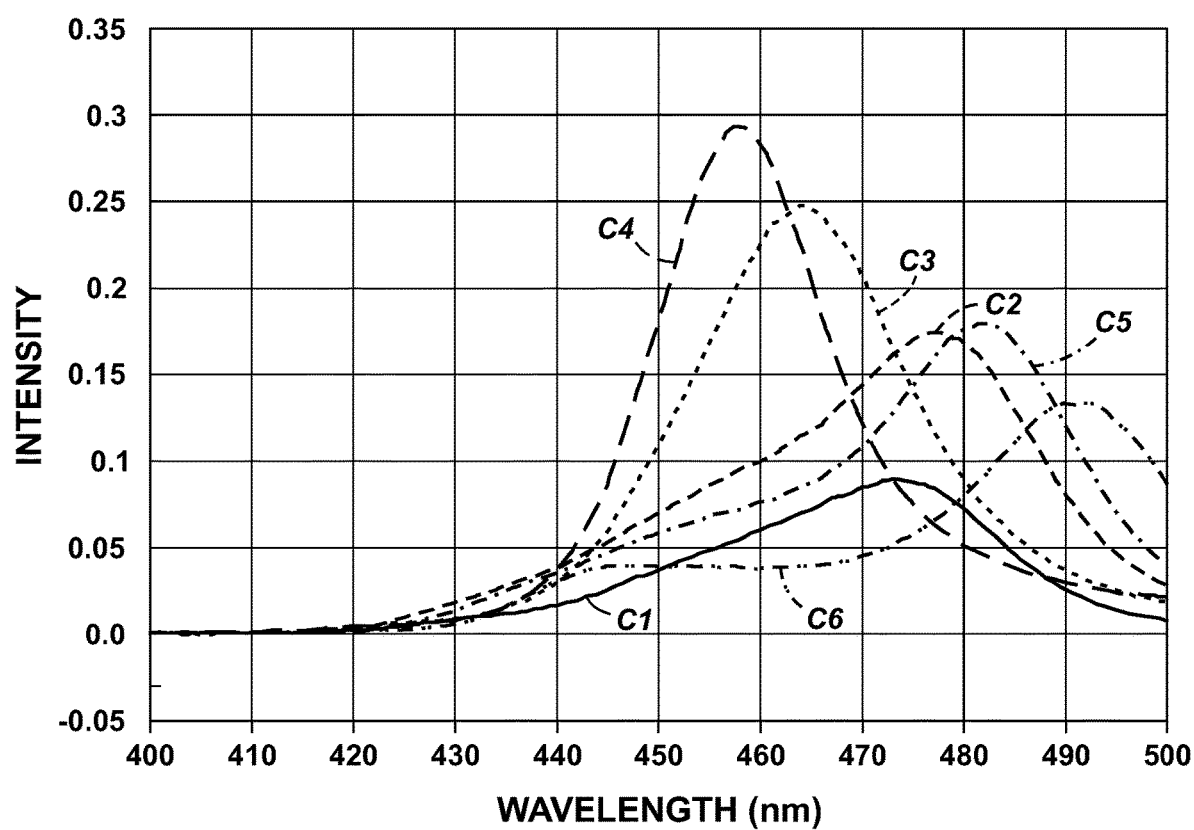
FIG. 11 shows spectra for Experimental Examples C1-C6 in the blue emission region.

Inventive example C1 has a BLEL3/R/BLEL2/G/BLEL1 structure similar to inventive Example B2. The remainder of OLED series C has a BLEL4/BLEL3/R/BLEL2/G/BLEL1 structure with yet another blue-light emitting layer (BLEL4) added between the R LEL and reflective surface. This increases blue emission, as shown in FIG. 11, but the improvement is sensitive to the relative location of BLEL2 within the microcavity. In addition, the results show that increasing the thickness of the microcavity in this format can affect the wavelength of the blue emission.

Tables 5-7 also demonstrate that the optimum location of BLEL1, BLEL2, BLEL3 and BLEL4 within the microcavity relative to the reflective layer is unexpectedly very different from that according to microcavity theory and yet, increased blue emission is still observed. For example, Inventive Example C3 have a similar structure to Model Format F with a non-blue LEL between two B LELs and a $3^{rd}$ and $4^{th}$ B LEL closest to the reflective surface, but as shown in Table D, this distance between two B LELs was not predicted to be optimum.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST

1 Substrate
3 Control Circuitry Layer
5 Optional planarization layer
7 Electrical contacts
9 First electrode segments
9A First electrode layer
9B Reflective layer
11 Non-light-emitting OLED layers
13 Second blue light-emitting layer
15, 64, 72, 80. 96, 105 Charge generation Layer
17 Non-blue light-emitting layer
19 Charge generation layer
21 First blue light-emitting layer
25 Semi-transparent second electrode
27, 92 Encapsulation
29 Color Filter Array
29B Blue color filter
29G Green color filter
29R Red color filter
30, 95 Microcavity
50 Substrate
52 Reflective layer
54 First electrode
56 Hole-injection Layer
58, 66, 74, 82, 99, 107 Hole transport layer
60 Second non-blue light-emitting layer
62, 78, 86, 96, 103 Electron transport layer
68 Second blue light-emitting layer
70 Electron transport layer
76 First non-blue light-emitting layer
84 First blue light-emitting layer
88 Electron-injection layer
90 Semi-transparent second electrode
94 Third blue light-emitting layer
101 Fourth blue light-emitting layer
100 Microdisplay with multimodal OLED microcavity
200 Multimodal OLED microcavity device
300 Multimodal OLED microcavity device
400 Multimodal OLED microcavity device
$L_0$ Microcavity Distance
$L_1$ Distance between midpoints of $1^{st}$ and $2^{nd}$ B LELs
$L_2$ Distance between midpoint $1^{st}$ B LEL and front surface of reflective surface
$L_3$ Distance between midpoint $2^{nd}$ B LEL and front surface of reflective surface
$L_4$ Distance between midpoints of $2^{nd}$ and $3^{rd}$ B LELs
$L_5$ Distance between midpoints of $3^{rd}$ and $4^{th}$ B LELs

The invention claimed is:

1. A multimodal light-emitting OLED microcavity device, comprising:
an opaque substrate;
a layer with a reflective surface over the substrate;
a first electrode over the reflective surface;
organic layers for light-emission including first and second blue light-emitting layers, the second blue light-emitting layer closer to the reflective surface and the first blue light-emitting layer further from the reflective layer than the second blue light-emitting layer, where a distance between the midpoints of the second and first blue-light emitting layers is $L_1$, and at least one non-blue light-emitting layer;
a semi-transparent second electrode with an innermost surface through which light is emitted;
wherein a distance $L_0$ between the reflective surface and the innermost surface of the semi-transparent second electrode is constant over the entire light-emitting area; and
the ratio $L_1/L_0$ is in the range of 0.30-0.40.

2. The multimodal light-emitting OLED microcavity device of claim 1 wherein a ratio $L_2/L_0$ is in the range of 0.90-0.98, where $L_2$ is a distance between the midpoint of the first blue light-emitting layer and the reflective surface.

3. The multimodal light-emitting OLED microcavity device of claim 2 wherein a ratio $L_3/L_0$ is in the range of 0.52-0.64, where $L_3$ is a distance between the midpoint of the second blue light-emitting layer and the reflective surface.

4. The multimodal light-emitting OLED microcavity device of claim 3 wherein the distance $L_0$ is in the range of 6500-7800 Å.

5. The multimodal light-emitting OLED microcavity device of claim 3 wherein the distance $L_0$ is in the range of 8000-9000 Å.

6. The multimodal light-emitting OLED microcavity device of claim 1 wherein the non-blue light-emitting layer is located between the first and second blue light-emitting layers.

7. The multimodal light-emitting OLED microcavity device of claim 6 wherein the non-blue light-emitting layer is green light-emitting.

8. The multimodal light-emitting OLED microcavity device of claim 7 wherein there is a second non-blue light-emitting layer that is located between the second blue light-emitting layer and the reflective surface.

9. The multimodal light-emitting OLED microcavity device of claim 8 wherein the second non-blue light-emitting layer is red light-emitting.

10. The multimodal light-emitting OLED microcavity device of claim 9 wherein there is a third blue light-emitting layer that is located between the red light-emitting layer and the reflective surface.

11. The multimodal light-emitting OLED microcavity device of claim 10 wherein there is a fourth blue light-emitting layer located between the third blue-light emitting layer and the reflective surface.

12. The multimodal light-emitting OLED microcavity device of claim 1 wherein the uppermost surface of the first electrode is the reflective surface.

13. A microdisplay comprising the multimodal light-emitting OLED microcavity device of claim 1.

14. The microdisplay of claim 13 wherein:
the substrate of the multimodal light-emitting OLED microcavity device includes a backplane with control circuitry for the individual operation of subpixels; and
there is a color filter array over the semi-transparent cathode that are aligned with the—a layer with a reflective surface over the substrate;
a first electrode over the reflective surface—a layer with a reflective surface over the substrate; and
a first electrode over the reflective surface.

15. The microdisplay of claim 14 wherein the some of the color filters in the color filter array are transparent or missing so that R, G, B and W subpixels are formed.

16. The multimodal light-emitting OLED microcavity device of claim 1 wherein the distance $L_0$ is in the range of 6500-7800 Å.

17. The multimodal light-emitting OLED microcavity device of claim 1 wherein the distance $L_0$ is in the range of 8000-9000 Å.

\* \* \* \* \*